(12) United States Patent
Li

(10) Patent No.: US 6,560,748 B2
(45) Date of Patent: May 6, 2003

(54) ENCODING DEVICE

(75) Inventor: Jifeng Li, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/932,243

(22) Filed: Aug. 17, 2001

(65) Prior Publication Data

US 2001/0056565 A1 Dec. 27, 2001

Related U.S. Application Data

(63) Continuation of application No. PCT/JP99/02034, filed on Apr. 16, 1999.

(51) Int. Cl.$^7$ ............................................. H03M 13/03
(52) U.S. Cl. ....................... 714/786; 714/788; 714/790; 375/295; 375/340
(58) Field of Search .................. 714/786, 788, 714/804, 820; 375/340, 219, 222, 225; 370/235

(56) References Cited

U.S. PATENT DOCUMENTS

| | | | |
|---|---|---|---|
| 5,446,747 A | | 8/1995 | Berrou ........................ 714/788 |
| 6,088,387 A | * | 7/2000 | Gelblum et al. ............ 375/222 |
| 6,374,386 B1 | * | 4/2002 | Kim et al. ................... 714/786 |
| 6,396,871 B1 | * | 5/2002 | Gelblum et al. ............ 375/222 |

FOREIGN PATENT DOCUMENTS

JP 01159874 6/1989

OTHER PUBLICATIONS

D. Divsalar et al. on the Design of Turbo Codes. Communications Systems and Research Section. Nov. 15, 1995. Pp. 99–121.

D. Divsalara et al. Multiple Turbo Codes for Deep Space Communications. Communication Systems Research SEction. May 15, 1995 pp. 66–77.

William E. Ryan. Performance of High Rate Turbo Codes on a PR4–Equalized Magnetic Recording Channel. The Klipsh Dept of Electrical and Computer Enginneering New Mexico State University. 1998.

Shunsuki Ochi, et al. Fast Decoding of Turbo–Code by Processing Map Algorithm in Parallel. Tokyo Institute of Technology. 1998. Pp. 1–6.

* cited by examiner

Primary Examiner—Emmanuel L. Moise
(74) Attorney, Agent, or Firm—Katten Muchin Zavis Rosenman

(57) ABSTRACT

An encoding device adds parity data to source data and outputs the data. The parity data is generated based on the output of the first encoding unit and the second encoding unit. The first encoding unit encodes the source data. The second encoding unit encodes the data obtained by a plurality of interleavers connected in parallel. The plurality of interleavers perform different randomizing processes on the source data.

18 Claims, 24 Drawing Sheets

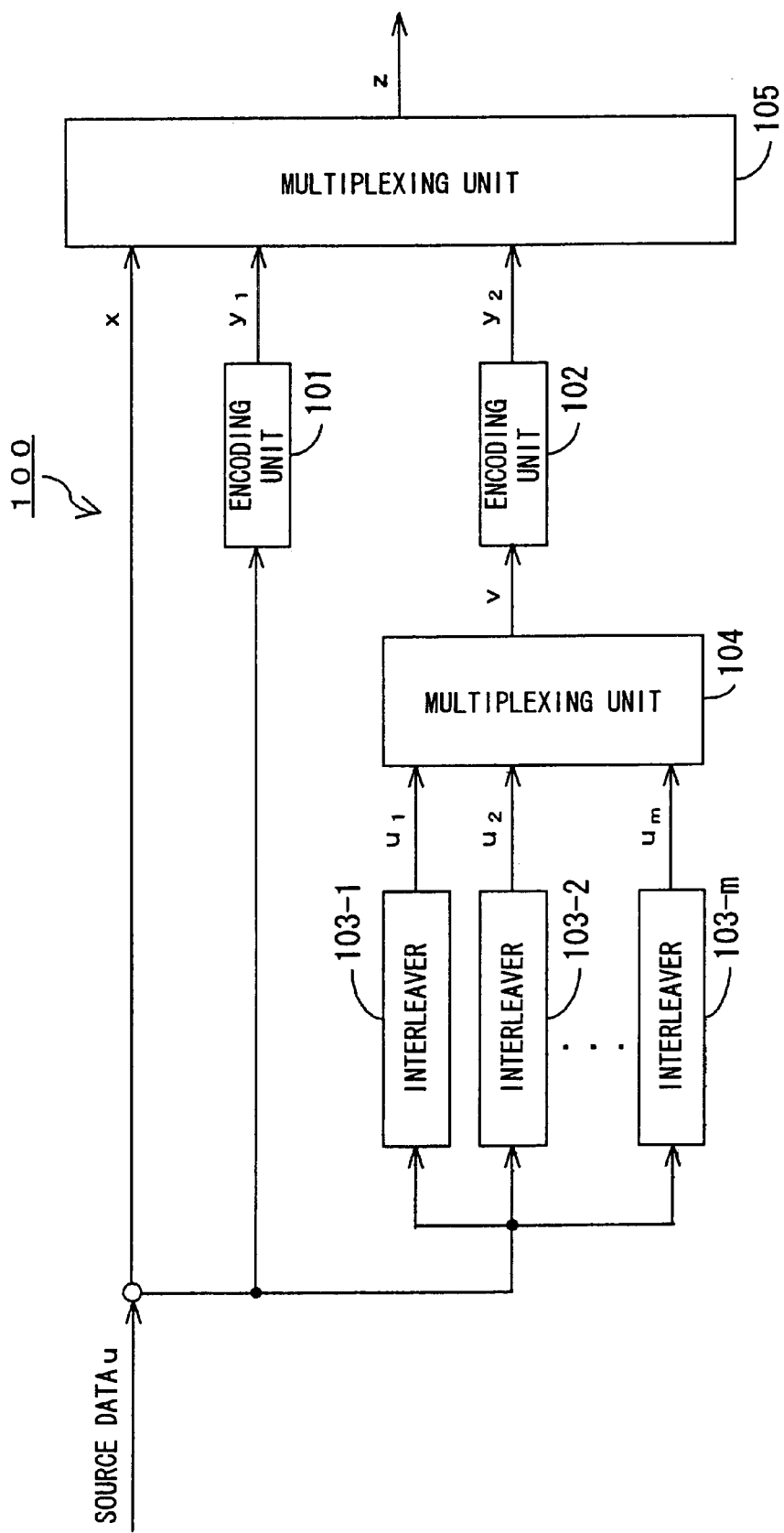
F I G. 6

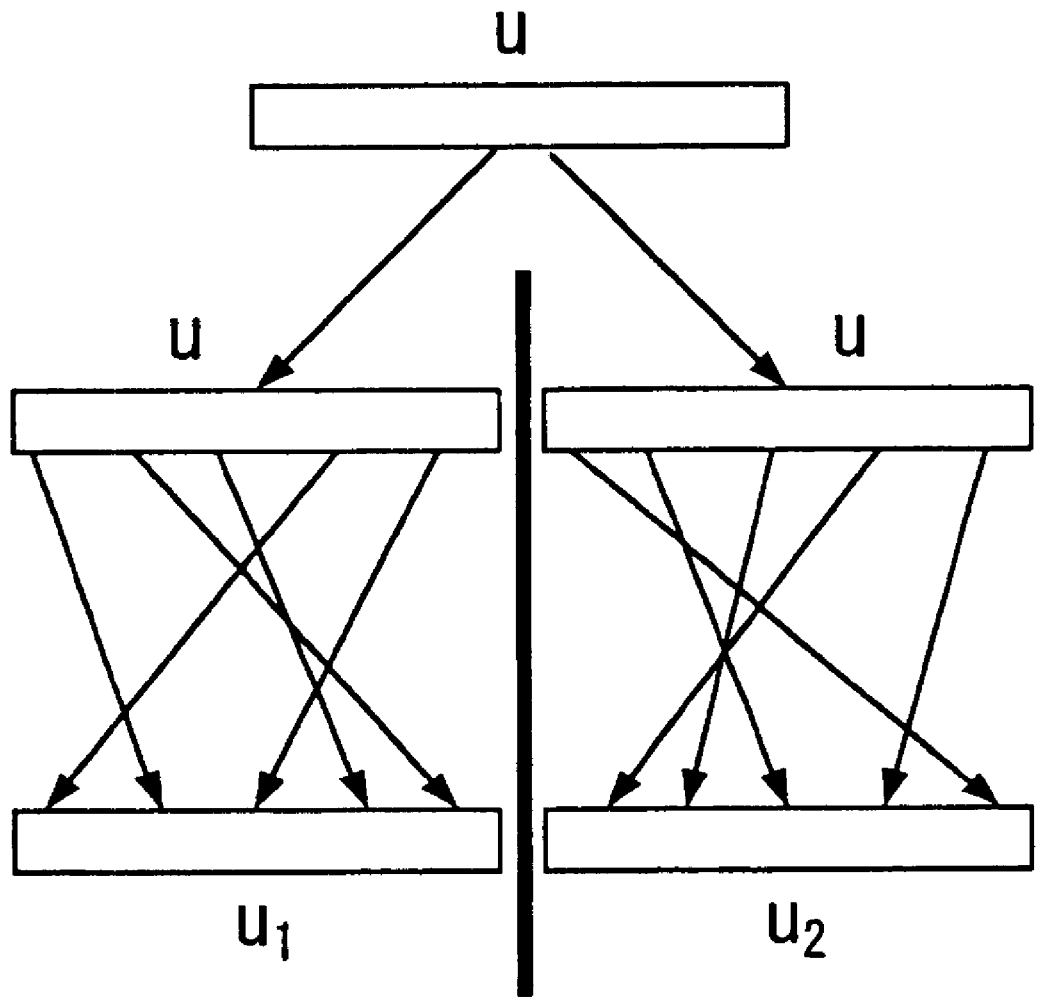
F I G. 7

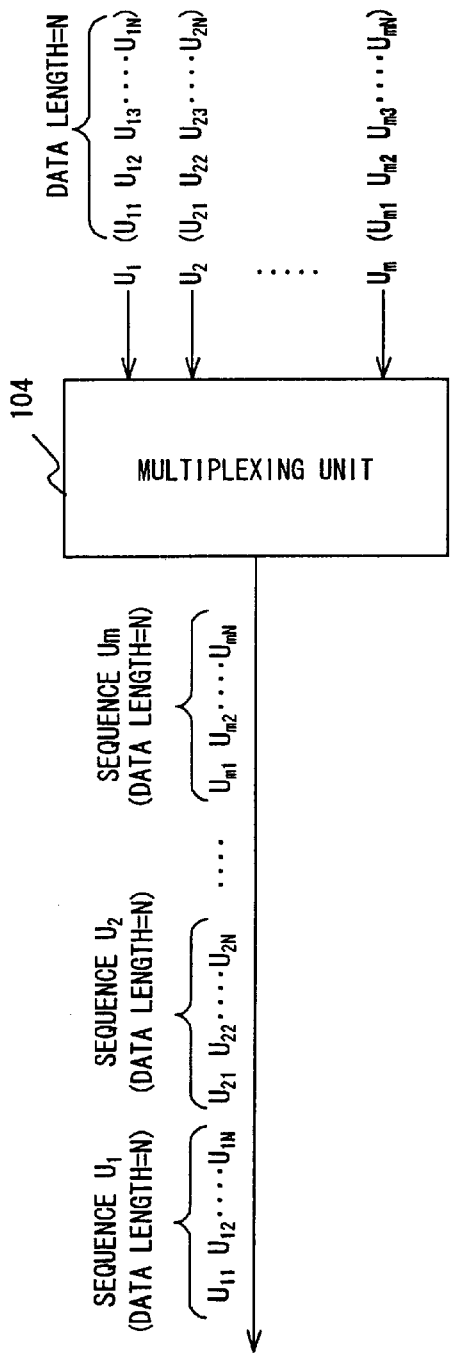
F I G. 8 A
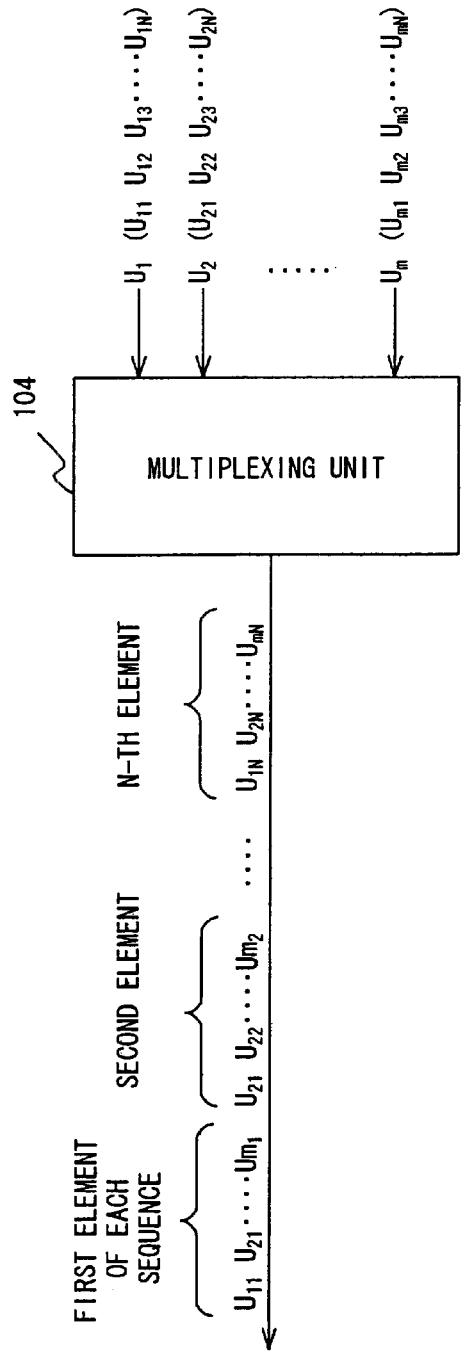
F I G. 8 B

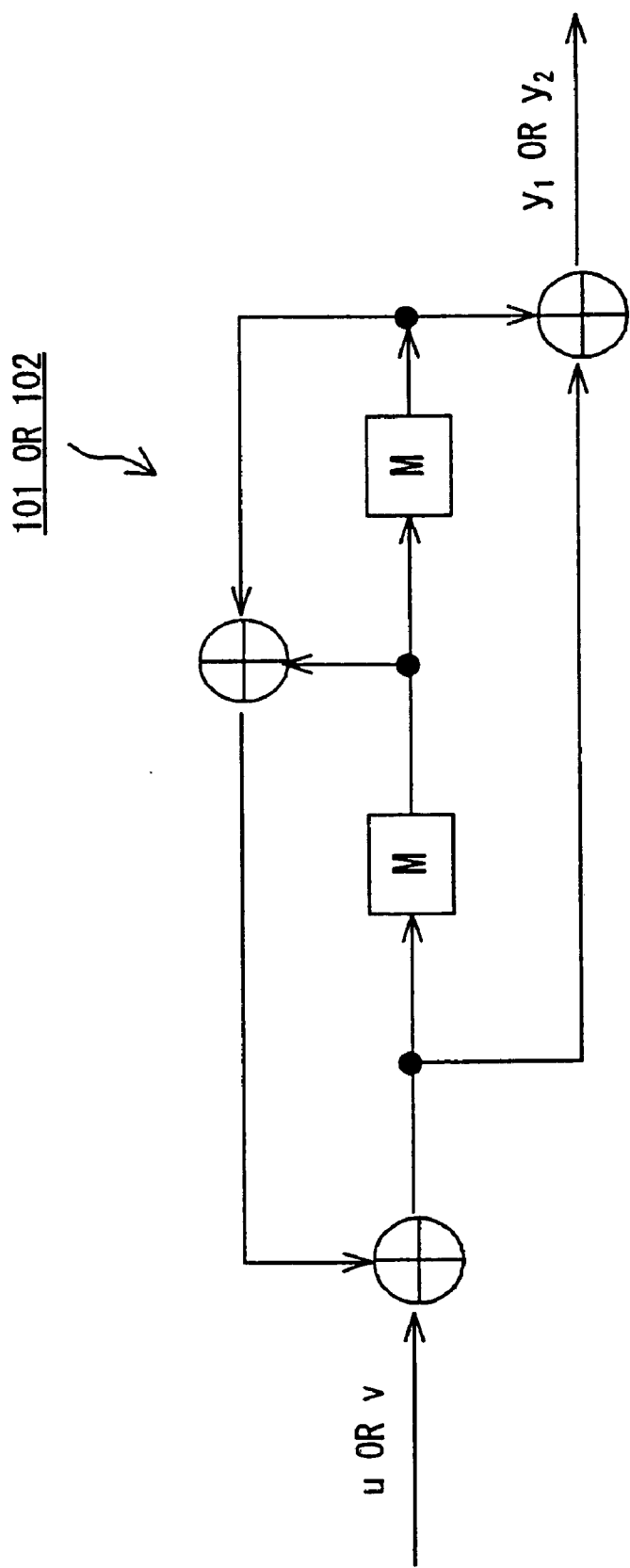
F I G. 1 2

Int: INTERLEAVER    Deint: DE-INTERLEAVER

ENCODING DEVICE

CROSS REFERENCE TO RELATED APPLICATION

This application is a continuation application of International Application No. PCT/JP99/02034, which was filed on Apr. 16, 1999.

BACKGROUND OF THE INVENTION

1. Field of the Invention

The present invention relates to an error-correcting code, and more specifically to a communications system using an error-correcting code, and an encoding device and a decoding device used in the communications system.

2. Description of the Related Art

In a new generation communications system for realizing multimedia communications, high-speed and high-quality data transmission is required. Especially, in a mobile communications system frequently incurring transmission errors, research and development are actively performed to reduce the errors.

An error-correcting code is well-known as an aspect of the technology of transmitting data with high quality. The error-correcting code refers to the technology of, for example, detecting or correcting an error generated in a transmission path.

FIG. 1 shows an example of the configuration of an existing encoding device using an error-correcting code. An encoding device 10 includes a plurality of encoding units (an encoding unit 11a and an encoding unit 11b in FIG. 1) arranged in parallel to each other. Here, a code obtained from a plurality of encoding units arranged in parallel to each other is referred to as "parallel concatenation codes" or "turbo codes". The parallel concatenation code has attracted much attention as the technology for realizing a high-speed and high-quality communications system.

The encoding device 10 outputs an encoded data sequence obtained by adding parity bits to source data when the source data is input. That is, the encoding device 10 generates a data sequence x and a parity data sequence y to correct the data sequence x for input source data u, and then multiplexes and outputs them. An output sequence z is the encoded data of the source data u. The encoding device has the configuration of performing an encoding operation in N bit units, and the source data u is a data sequence of N bits.

The input source data u is provided for a multiplexing unit 14 as the data sequence x to be transmitted. At the same time, the source data u is provided for the encoding unit 11a, and also provided for the encoding unit 11b through an interleaver 12. The interleaver 12 temporarily stores the input source data u of N bits, and then reads and outputs the stored source data u in an order different from the input order. That is, the interleaver 12 rearranges the order of the data elements forming the source data u. Thus, the source data u is randomized. The output of the interleaver 12 is provided as a data sequence v for the encoding unit 11b. As a result, the encoding units 11a and 11b receives different data sequence from each other.

The encoding unit 11a generates a parity data sequence y1 for the received source data u, and the encoding unit 11b generates a parity data sequence y2 for the received data sequence v. Each of the encoding units 11a and 11b performs a convolutional encoding process.

A puncturing unit 13 selects the output of the encoding units 11a and 11b based on a predetermined selection pattern (puncturing pattern). The puncturing unit 13 normally selects 1 bit each from the output of the encoding units 11a and 11b alternately. In this case, the parity data sequence y output from the puncturing unit 13 includes the first bit of the sequence y1, the second bit of the sequence y2, the third bit of the sequence y1, the fourth bit of the sequence y2, and so forth. The encoding device 10 can also use a desired selection pattern depending on a requested encoding rate.

The multiplexing unit 14 multiplexes the data sequence x and the parity data sequence y for correction of the data sequence x, and outputs the result as the data sequence z.

The encoding device shown in FIG. 1 is disclosed in detail by the U.S. Pat. No. 5,446,747.

FIG. 2 shows the characteristic of a code. "BER" refers to a bit error rate. "Eb/No" refers to the energy per bit for specific noise.

The characteristic of a code is normally evaluated by the "energy per bit required to obtain a specific bit error rate". For example, an excellent code requires less energy per bit to obtain a specified bit error rate. In other word, an excellent code provides a lower bit error rate when a signal is transmitted with specified energy per bit.

A line 1 shows a result of the simulation of the characteristic when the encoding device shown in FIG. 1 is used. The characteristic is much more excellent than that obtained when the conventional code other than the parallel concatenation code is used.

However, it is known that an error floor phenomenon occurs when a parallel concatenation code is used. The error floor phenomenon means a phenomenon that the tilt of the bit error rate to an "Eb/No" becomes smaller when the "Eb/No" increases. That is, the bit error rate basically lowers when the "Eb/No" increases, but the bit error rate hardly changes when the error floor phenomenon occurs although the "Eb/No" increases. For example, in the example shown in FIG. 2, it is desired that the line 1 indicates the characteristic as shown by broken lines. However, the error floor phenomenon practically occurs, and the characteristic shown in the solid line is obtained.

It is estimated that the error floor phenomenon occurs due to the shortest distance.

As a technology for suppressing the error floor phenomenon, a method of increasing the number of encoding units provided in parallel into three or more as shown in FIG. 3 is known. This technology is often referred to as a "multi-dimensional turbo codes".

In FIG. 2, a line 2 shows a result of the simulation of the characteristic when the multi-dimensional turbo code is used. Using the multi-dimensional turbo code, no error floor phenomenon occurs at least in the simulation. Therefore, a smaller "Eb/No" is required to obtain high transmission quality. In the example shown in FIG. 2, when a multi-dimensional turbo code is used, the energy required to obtain high transmission quality of the bit error rate of $10^{-5}$ or lower is less than the energy required when the encoding device shown in FIG. 1 is used.

However, when a multi-dimensional turbo code is used, the bit error rate sharply deteriorates when the "Eb/No" decreases. In the example shown in FIG. 2, when the "Eb/No" is equal to "1" or smaller, the characteristic obtained when the multi-dimensional turbo code is used is inferior to the characteristic obtained when the encoding device shown in FIG. 1 is used.

In addition, when the multi-dimensional turbo code is used, the configuration of a decoding device becomes complicated. That is, the decoding device basically requires decoding units which are to be equal in number to the encoding units provided for the encoding device. Therefore, when the number of the encoding units provided in parallel increases, the number of the decoding units provided for the decoding device increases correspondingly. Therefore, the multi-dimensional turbo code prevents the realization of a smaller and cost-saving decoding device.

Thus, in the conventional technology, a encoding-decoding system cannot successfully improve the transmission characteristic with a smaller and cost-saving decoding device realized.

The present invention aims at providing an encoding-decoding system capable of obtaining an excellent transmission characteristic without a complicated configuration of a decoding device.

SUMMARY OF THE INVENTION

The encoding device according to the present invention includes a first encoding unit, a plurality of randomizing units, a second encoding unit, and an output unit. The first encoding unit encodes source data or a data sequence obtained by randomizing the source data. The plurality of randomizing units generate data sequence different from each other by randomizing the source data. The second encoding unit encodes the output from the plurality of the randomizing units. The output unit outputs the source data, and the parity data obtained based on the output from the first and second encoding units.

The first and second encoding units generates a parallel concatenation code. The parity data is generated based on the output of the first and second encoding units, and the output of the plurality of randomizing units is provided for the second encoding unit. That is, the parity data is affected by randomizing results of the plurality of different randomizing units. Therefore, the error floor phenomenon, that is, one of the problems with the parallel concatenation code, can be suppressed.

The decoding device generally includes decoding elements corresponding to encoding elements in the encoding device. Therefore, if the number of encoding elements increases in the encoding device, then the number of decoding elements also increases in the decoding device. However, the encoding device according to the present invention is provided with one second encoding unit for a plurality of randomizing units. That is, even if the number of randomizing units increases, the number of the second encoding unit remains unchanged. Therefore, the error floor phenomenon can be suppressed without complicating the configuration of the decoding device.

BRIEF DESCRIPTION OF THE DRAWINGS

FIG. 6 is a block diagram of the encoding device according to an embodiment of the present invention;

FIG. 7 shows an operation of a plurality of interleavers;

FIGS. 8A and 8B show operations of the multiplexing unit;

FIG. 12 shows the circuit of the encoding unit;

DESCRIPTION OF THE PREFERRED EMBODIMENTS

The encoding device according to the present invention can be applied to various fields, and can be used in a communications system and a data storage device.

Figure 4:
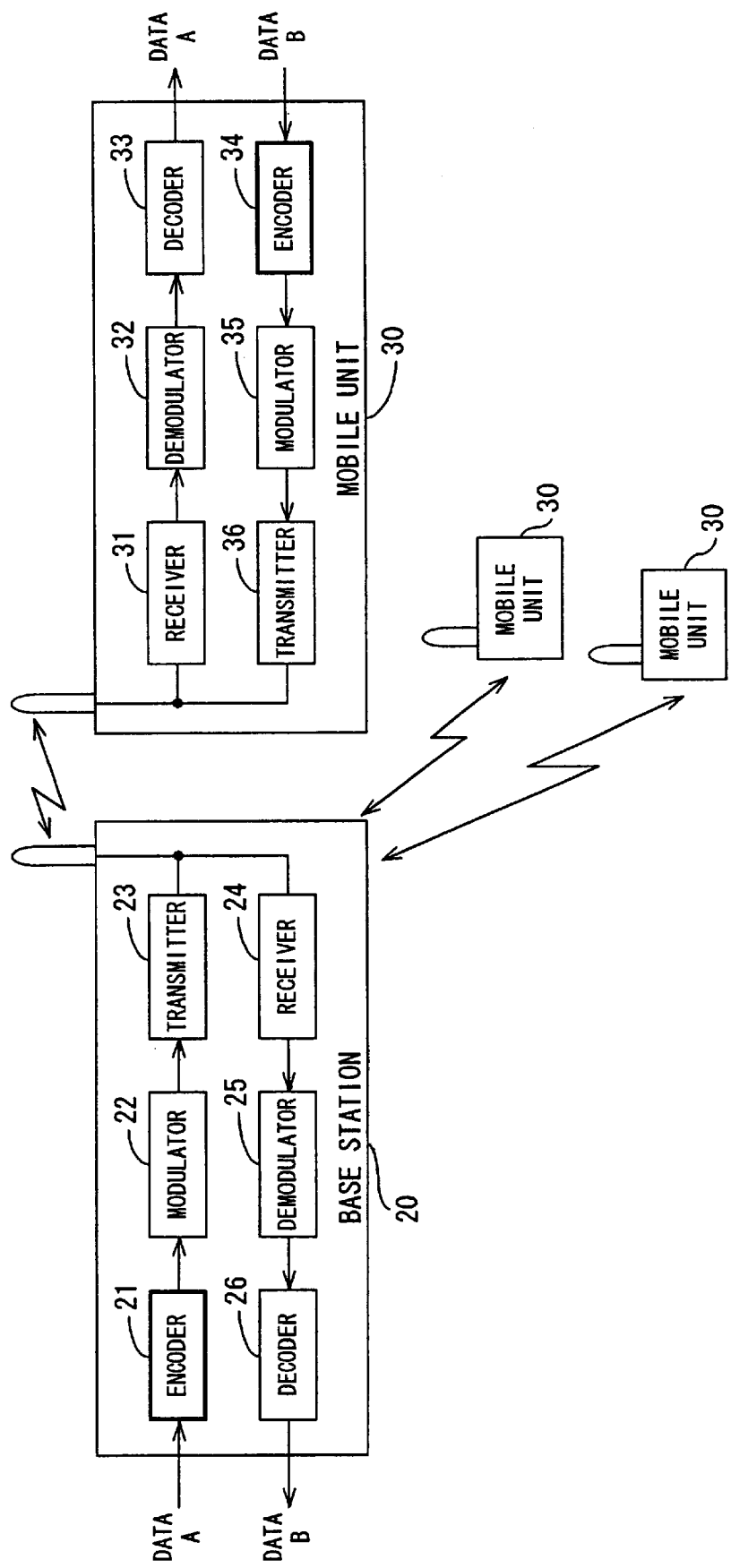
FIG. 4 shows the configuration of a mobile communications system to which the encoding device according to the present invention is applied.

FIG. 4 shows the configuration of the mobile communications system to which the encoding device according to an embodiment of the present invention is applied. The radio system can be, for example, a CDMA system. A base station 20 comprises an encoder 21 for encoding data (data A) to be transmitted to a mobile unit 30, a modulator 22 for modulating the encoded data, and a transmitter 23 for transmitting the modulated data. A radio signal transmitted from the base station 20 is received by a receiver 31 of the mobile unit 30, demodulated by a demodulator 32, and decoded by a decoder 33. Furthermore, the base station 20 comprises a receiver 24 for receiving a signal transmitted from the mobile unit 30, a demodulator 25 for demodulating the received signal, and a decoder 26 for decoding the demodulated data. The mobile unit 30 encodes the data (data B) to be transmitted to the base station 20 using an encoder 34, modulates the encoded data by a modulator 35, and transmits the modulated data by a transmitter 36.

In the above mentioned communications system, the encoding device according to the present embodiment corresponds to the encoder 21 in the base station 20 or the encoder 34 in the mobile unit 30.

Figure 5:
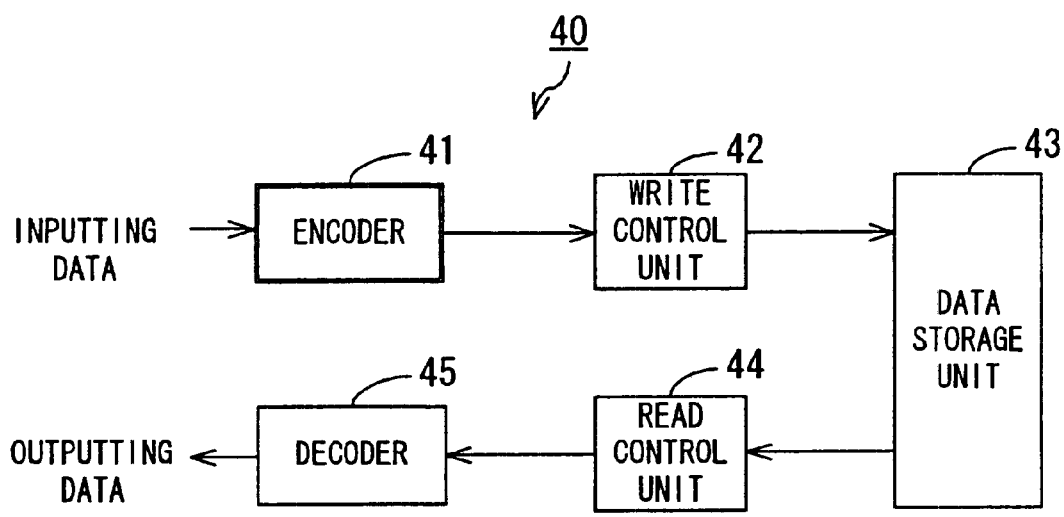
FIG. 5 shows the configuration of the storage device to which the encoding device according to the present invention is applied.

FIG. 5 shows the configuration of the storage device to which the encoding device according to the present embodiment is applied. A storage device 40 comprises an encoder 41 for encoding the data to be written to a data storage unit 43, and a write control unit 42 for writing the encoded data to a data storage unit 43. The data storage unit 43 is, for example, a storage medium such as an optical disk, a magnetic disk, semiconductor memory, etc. The storage device 40 comprises a read control unit 44 for reading data from the data storage unit 43, and a decoder 45 for decoding the read data. In the above mentioned storage device, the encoding device according to the present embodiment corresponds to the encoder 41.

According to the embodiments described below, the encoding device according to the present embodiment is used in the communications system shown in FIG. 4.

FIG. 6 is a block diagram of the encoding device according to an embodiment of the present invention. An encoding device 100 uses a parallel concatenation code by encoding elements (encoding units 101 and 102) provided in parallel. Furthermore, the encoding device 100 encodes the source data u using a systematic code. In the systematic code, the data to be transmitted and the data (hereinafter referred to as "parity data") for correcting an error generated when the data is transmitted are separated from each other. That is, when the source data u is input, the encoding device 100 generates the data sequence x to be transmitted, and the parity data sequence to be added to the data sequence x. The encoding device 100 performs an encoding process on N bits of input data. That is to say, the data length of the source data u is "N" bits.

The source data u input to the encoding device 100 is provided for a multiplexing unit 105 as the data sequence x to be transmitted. The source data u is provided for the encoding unit 101. Upon receipt of the source data u, the encoding unit 101 generates a parity data sequence y1 by encoding the source data u. Furthermore, the source data u is also provided for a plurality of interleavers 103-1 through 103-m.

The interleavers 103-1 through 103-m temporarily store the source data u in N bits each, and then reads and outputs the stored source data u in an order different from the input order. Thus, the source data u is randomized by the interleavers 103-1 through 103-m, respectively. The interleavers 103-1 through 103-m perform respective randomizing processes. That is to say, the interleavers 103-1 through 103-m outputs different data sequence u1 through um, respectively. The data length of each of the data sequence u1 through um is the same as the length of the source data u, that is, "N" bits.

FIG. 7 shows the operation of a plurality of interleavers. In this example, two interleavers are connected in parallel.

The source data u is provided for each interleaver. Each interleaver changes the order of the data elements forming the source data u according to the predetermined algorithm. The algorithms performed by respective interleavers are different from one another. In the above mentioned operations, different data sequences are generated by the interleavers.

A multiplexing unit 104 multiplexes the output of the interleavers 103-1 through 103-m. That is, the multiplexing unit 104 sequentially multiplexes the data sequence u1 through data sequence um, which are the outputs of the interleavers 103-1 through 103-m, as shown in FIG. 8A. The data length of each of the data sequence u1 through data sequence um is "N" bits. Therefore, when the output of the interleavers 103-1 through 103-m is provided for the multiplexing unit 104, the data length of the output sequence from the multiplexing unit 104 is "m×N" bits. The data sequence output from the multiplexing unit 104 is hereinafter referred to as "data sequence v".

The operation of the multiplexing unit 104 is not limited to the operation shown in FIG. 8A, but a data element forming each of the data sequence u1 through um can be sequentially multiplexed in order bit by bit as shown in FIG. 8B.

Back in FIG. 6, the data sequence v output from the multiplexing unit 104 is provided for the encoding unit 102. That is to say, when the source data u is input to the encoding device 100, the data sequence v having the data length of "m×N" bits is input to the encoding unit 102. Then, the encoding unit 102 generates the parity data sequence y2 by encoding the data sequence v.

The multiplexing unit 105 multiplexes the data sequence x and the parity data sequences y1 and y2 for correcting the data sequence x, and outputs the result as encoded data z.

Figure 9:
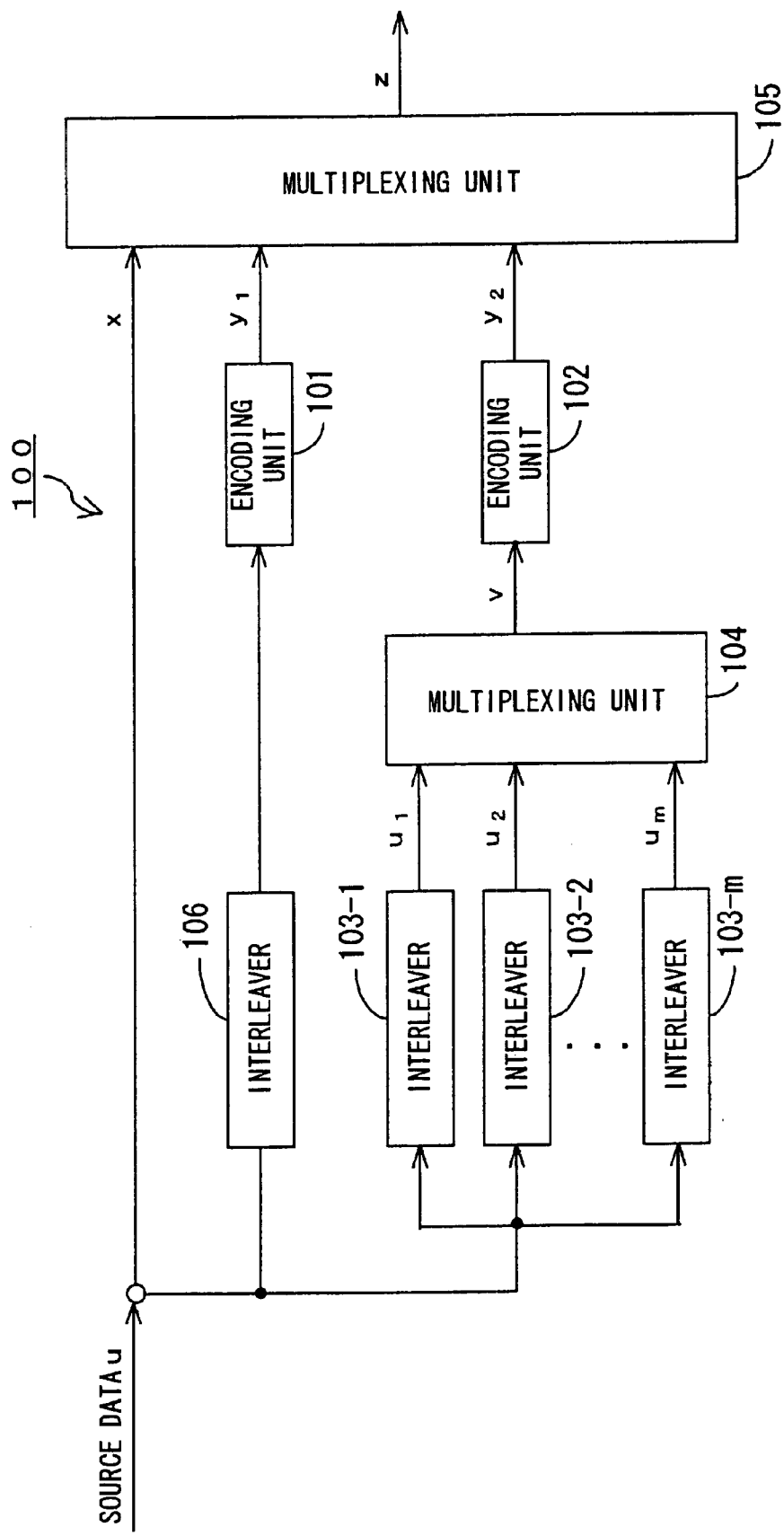
FIGS. 9 through FIG. 11 show examples of a variation of the encoding device according to the present invention.
Figure 10:
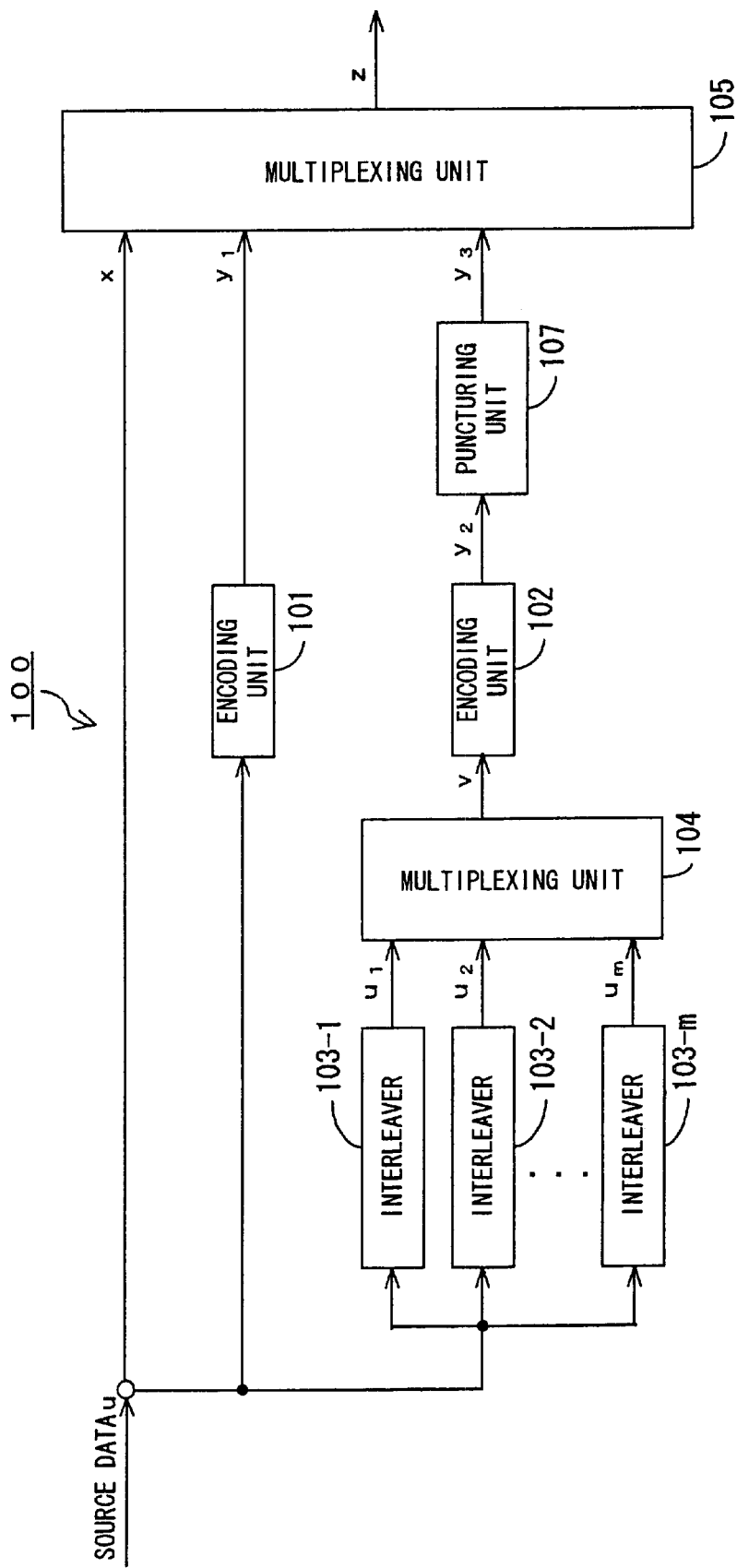
Figure 11:
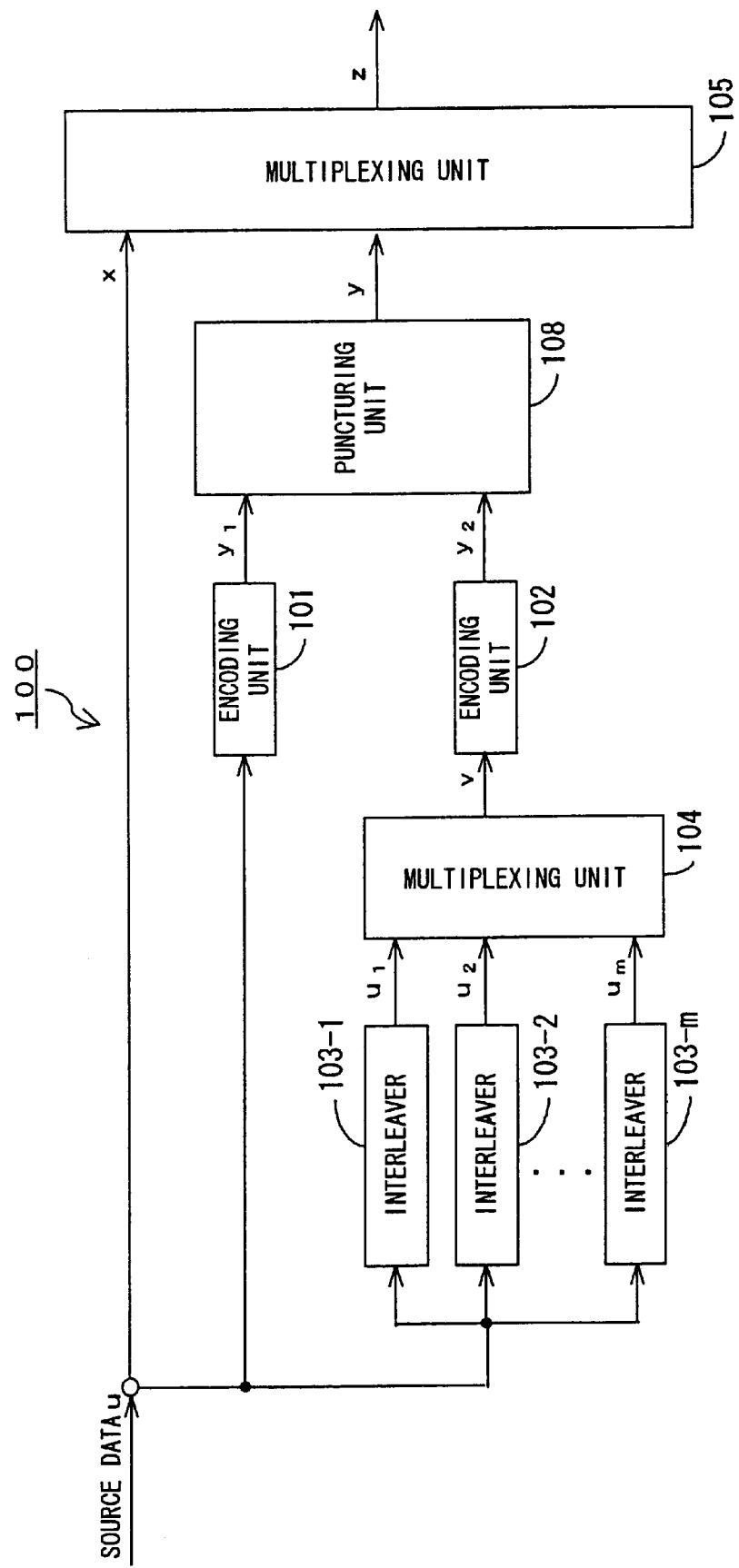

The encoding device according to the present invention is not limited to the configuration shown in FIG. 6. For example, as shown in FIG. 9, an interleaver 106 for randomizing the source data u can be installed at the stage before the encoding unit 101. In this case, the randomizing process by the interleaver 106 is different from the randomizing processes performed by the interleavers 103-1 through 103-m. In addition, as shown in FIG. 10, a puncturing unit 107 can be provided at the stage after the encoding unit 102. In this case, the puncturing unit 107 selects one or more data elements from the parity data sequence y2 generated by the encoding unit 102 based on a predetermined selection pattern or an adaptively changed selection pattern. Furthermore, as shown in FIG. 11, a puncturing unit 108 can be installed to select one or more data elements from the parity data sequences y1 and y2 generated by the encoding units 101 and 102.

FIG. 12 shows a circuit of the encoding unit 101 or 102. In this embodiment, the encoding units 101 and 102 have the same configurations, but can have different configurations.

To perform a convolutional code process on an input data sequence, each encoding unit comprises a plurality of memory units M connected in sequence, and one or more adders. Each memory unit M is, for example, a flip-flop, and stores a data element of 1 bit. In this case, the memory units M connected in sequence form a shift register. The adder is, for example, an arithmetic unit for an exclusive logical sum, or a mod-2 adder. In the configuration shown in FIG. 12, the encoding unit comprises two memory units M, and three adders.

Each time a new data element is input, the encoding unit outputs a data element obtained by adding up the newly input data element and the data elements stored in the memory units M. That is to say, in this convolutional process, a data element to be output corresponding to a newly input data element is generated based on one or more already stored data elements, and the newly input data element.

Each memory unit M of each encoding unit is set to "0" as an initial value. When an N bit data sequence is input, each encoding unit outputs an N bit parity data sequence followed by a tail bit. The data length of the tail bit is, for example, equal to the number of memory units M.

Since the convolutional process is a well-known technology to one of ordinary skill in the art, the detailed explanation is omitted here.

With the above mentioned configuration, the encoding device 100 outputs a data sequence x to be transmitted, and a parity data sequence added to the data sequence x, when a source data u is input. The parity data sequence is generated based on the parity data sequence y1 generated by the encoding unit 101 and the parity data sequence y2 generated by the encoding unit 102 with any configuration shown in FIGS. 6, and 9 through 11. That is, when the encoding device 100 outputs each data element of the data sequence x (source data u), it outputs a data element of the parity data sequence y1 and y2 corresponding to the data element of the data sequence x by associating it with the data element of the data sequence x. When the parity data sequence y1 and y2 are selectively output using the puncturing unit 107 or 108, a part of the parity data sequences is not output, but is discarded.

The encoded data sequence z output from the encoding device 100 is modulated by a modulator (for example, the modulator 22 shown in FIG. 4), and then transmitted to a transmission path. A modulating method is not specified, but can be, for example, a CDMA system. In a transmission path, a signal is transmitted as an analog signal. Each data element in the encoded data sequence z generated by the encoding device can be referred to as a symbol.

Described below is a decoding device for decoding the encoded data sequence generated by the encoding device 100. Various methods are known for use in a decoding process, but data is basically decoded by performing an encoding process in the reverse order.

Figure 13:
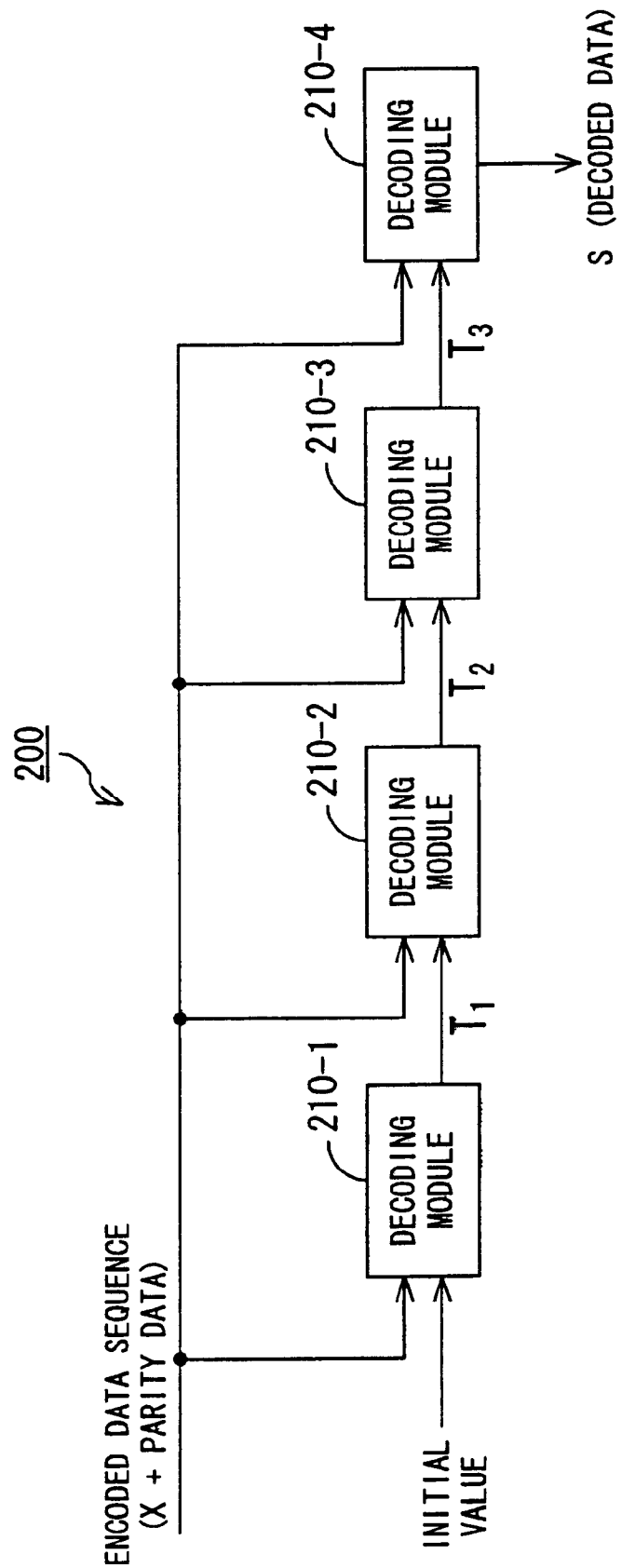
FIG. 13 is a block diagram of the decoding device.

FIG. 13 is a block diagram of a decoding device for decoding an encoded data sequence. The data modulated by a transmission terminal is demodulated by a demodulator (for example, the demodulator 32 shown in FIG. 4), and is then provided for a decoding device 200. The input data to the decoding device 200 is an analog signal.

The decoding device 200 is basically configured by serially connecting a plurality of decoding modules having the same structures. In the example shown in FIG. 13, four decoding modules are connected. By increasing the number of decoding modules, the decoding characteristic can be improved.

Each of the decoding modules 210-1 through 210-4 receives data sequence z (data sequence x and parity data sequence) and a predicted value of the data sequence x (sequence T) predicted by the decoding module at the previous stage, and then newly predicts a data sequence x. The newly predicted data sequence x is transmitted to a decoding module at the next stage. The decoding module at the final stage outputs a decoding result S.

Figure 14:
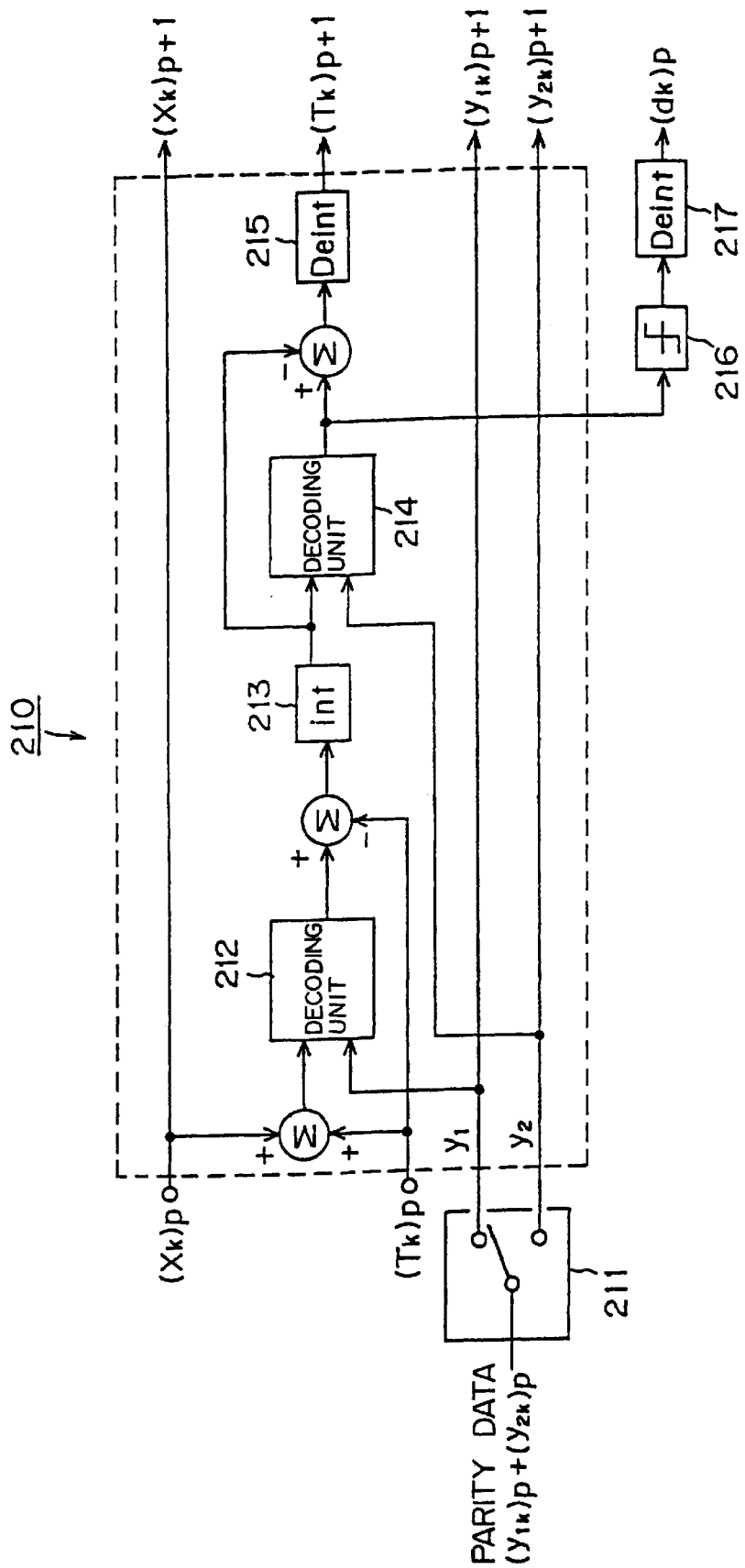
FIG. 14 is a block diagram of a decoding module.

FIG. 14 is a block diagram of a decoding module forming part of the decoding device according to the present embodiment. The decoding modules 210-1 through 210-4 basically have the same structures, and the decoding module 210 indicates one of the decoding modules 210-1 through 210-4. Although not shown in the attached drawings, there is a function of demultiplexing a data sequence x multiplexed with a parity data sequence by the encoding device 100 before the stage of the decoding module 210-1.

Upon receipt of a symbol xk contained in the data sequence x, the decoding module 210 performs a decoding process using the symbol of the parity data sequence corresponding to the symbol xk. Described below is the operation of the decoding module 210.

A de-puncturing unit 211 receives a parity data sequence, provides a parity data sequence y1 generated by the encoding unit 101 for a decoding unit 212, and provides a parity data sequence y2 generated by the encoding unit 102 for a decoding unit 214. In a case where the encoding device 100 comprises a puncturing unit, as shown in FIG. 10 or 11, the de-puncturing unit 211 performs an operation corresponding to the selection pattern provided for the puncturing unit. Practically, for example, when a data element y2$k$ contained in the parity data sequence y2 is discarded by a puncturing unit in the encoding device, the de-puncturing unit 211 generates "0" as regenerated data of the data element 2$k$ and provides it for the decoding unit 214.

The decoding unit 212 receives a sum of the data sequence x and a predicted value of the data sequence x generated by the decoding module at the previous stage, and parity data sequence y1, and decodes the data sequence x. The decoding unit 212 performs a decoding process corresponding to the encoding unit 101 provided in the encoding device 100.

The difference between the output of the decoding unit 212 and a predicted value of the data sequence x is provided for an interleaver 213. The interleaver 213 basically has the same configuration as a combination of the interleavers 103-1 through 103-m and the multiplexing unit 104 provided in the encoding device 100. Therefore, when the data of "N" bits, the interleaver 213 outputs data of "m×N" bits.

The decoding unit 214 receives the output of the interleaver 213 and the parity data sequence y2, and decodes the data sequence x. The decoding unit 214 performs the decoding process corresponding to the encoding unit 102 provided in the encoding device 100.

The decoding unit 212 and the decoding unit 214 perform, for example, the maximum likelihood decoding method. As an example of the maximum likelihood decoding method, a Viterbi algorithm is used.

A de-interleaver 215 receives a difference between the output of the decoding unit 214 and the output of the interleaver 213. The de-interleaver 215 basically performs a process inverse to the randomizing process performed by the interleaver 213. Therefore, when the data of "m×N" bits is input, the de-interleaver 215 outputs data of N bits. The output of the de-interleaver 215 is provided as a predicted value of the data sequence x for the decoding module at the next stage.

The output of the decoding unit 214 is compared with a predetermined threshold by a judging unit 216. That is, the judging unit 216 performs a soft determination process. The determination result by the judging unit 216 is binary data, and sequentially input bit by bit to a de-interleaver 217. The de-interleaver 217 is basically the same as the de-interleaver 215, and performs a process inverse to the randomizing process performed by the interleaver 213. The output of the de-interleaver 217 is regenerated data of the source data u.

The de-puncturing unit 211 can be provided only in the decoding module 210-1, which is installed at the first stage of the decoding device 200. The judging unit 216 and the de-interleaver 217 can be provided in each decoding module, and can be provided only in the decoding module 210-4 at the last stage.

The basic configuration and operation of the above mentioned decoding device can be realized using the well-known technology. For example, it is described in the U.S. Pat. No. 5,446,747. However, the interleaver 213 and the de-interleaver 217 provided in the decoding device 200 are different from the existing units.

Upon receiving a data sequence of N bits, the existing interleaver generates a randomized data sequence of N bits by randomizing the received data sequence. Upon receiving a randomized data sequence of N bits, the existing de-interleaver generates a data sequence of N bits by inversely randomizing the received data sequence.

Figure 15A:
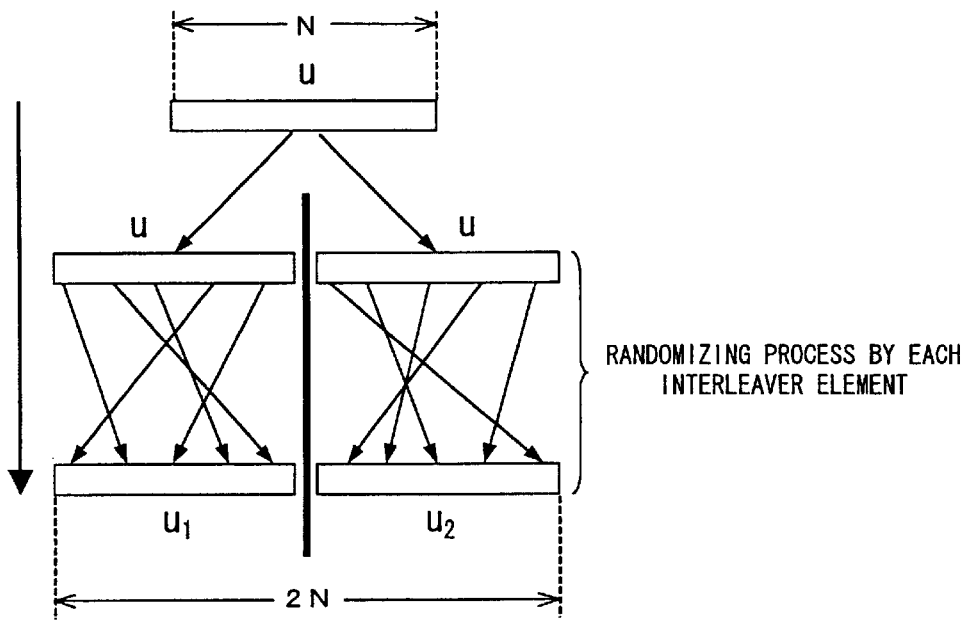
FIG. 15A shows an operation of an interleaver.

On the other hand, the interleaver 213 according to the present embodiment contains m (2 in FIG. 15A) interleaver elements as shown in FIG. 15A, and, when a data sequence of N bits is input, the interleaver elements randomize data sequence, respectively, and sequentially output the randomized data sequence. As a result, when data of N bits is input, the interleaver 213 outputs data of "m×N" bits.

Figure 15B:
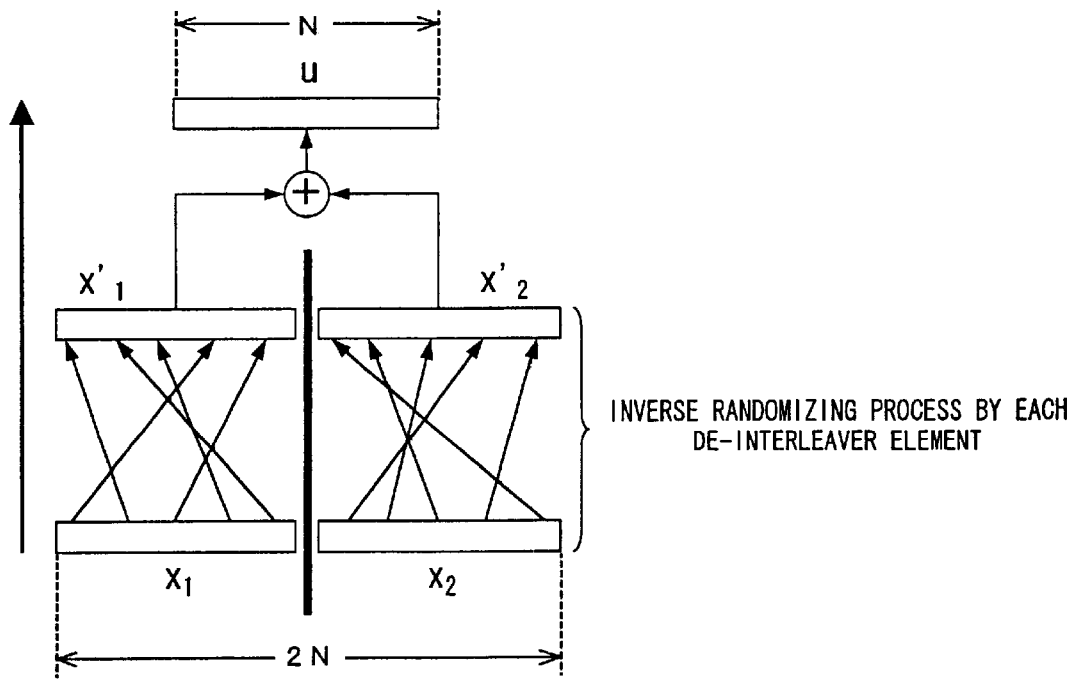
FIG. 15B shows an operation of a de-interleaver.

On the other hand, the de-interleaver 217 according to the present embodiment contains m (2 in FIG. 15B) de-interleaver elements as shown in FIG. 15B, and, when data sequence of "m×N" bits is input, data sequence of N bits is provided for each de-interleaver element, and each de-interleaver element inversely randomizes corresponding data sequence, respectively. The output of each de-interleaver element is multiplexed for each symbol (for each element). As a result, when data of "m×N" bits is input, a de-interleaver 217 outputs data of N bits.

Figure 16:
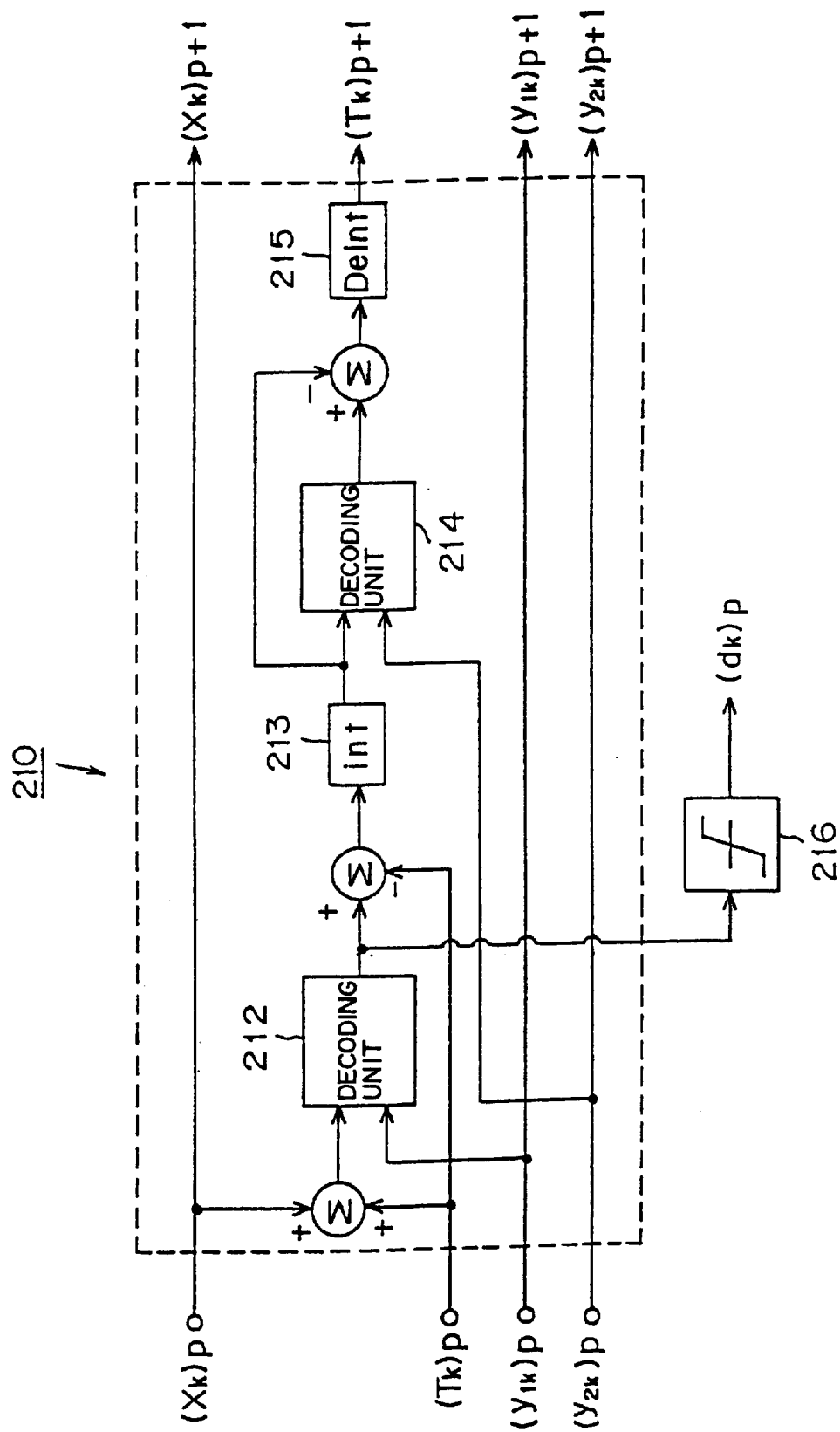
FIG. 16 shows an example of a variation of a decoding module shown in FIG. 14.

FIG. 16 shows an example of a variation of the decoding module shown in FIG. 14. In this decoding module, the judging unit 216 generates binary data in the soft determination process of comparing the output of the decoding unit 212 and a predetermined threshold. With this configuration, as compared with the configuration shown in FIG. 14, the de-interleaver 217 is not required, thereby contributing to realizing a smaller decoding device.

Figure 17:
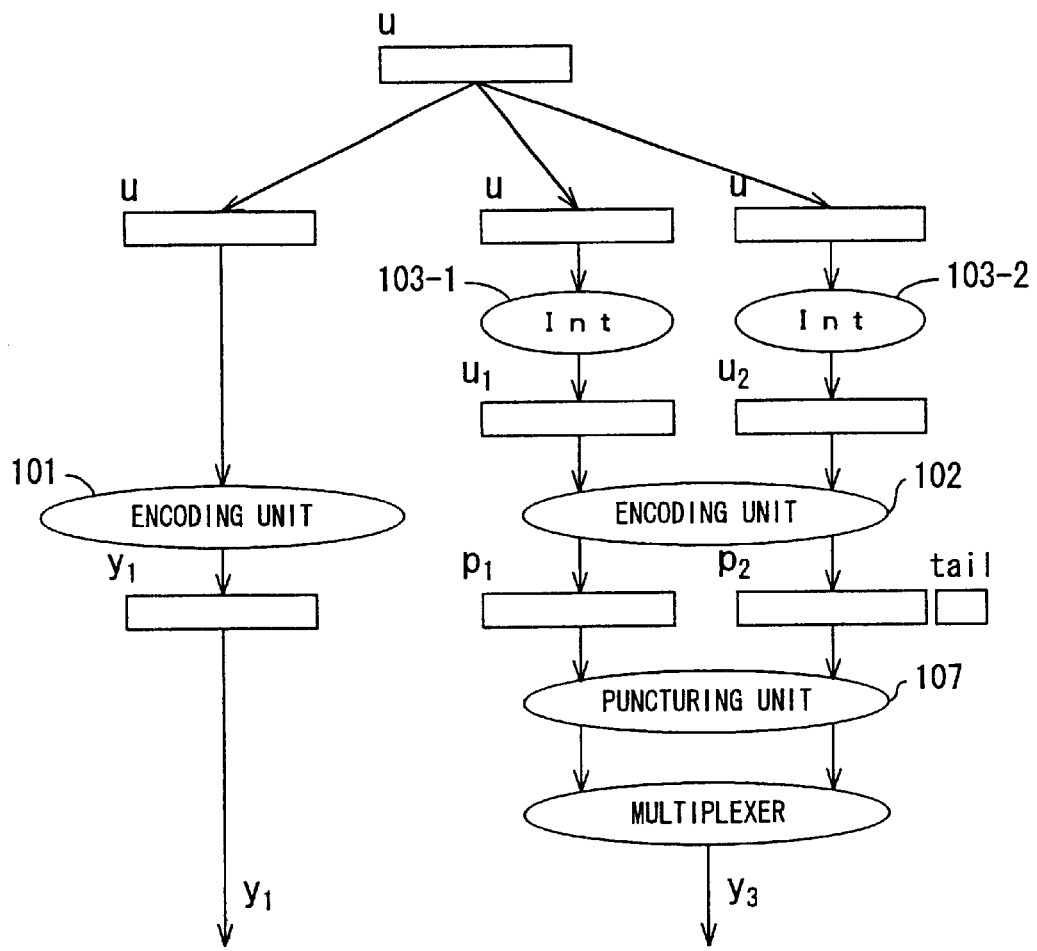
FIG. 17 shows the method of generating parity data.

FIG. 17 shows a method of generating parity data using the encoding device according to the present embodiment. In this method, the encoding device shown in FIG. 10 is described. For simple explanation, it is assumed that two interleavers 103-1 and 103-2 are provided in parallel as a plurality of interleavers.

To generate parity data, the source data u is provided for the encoding unit 101, and the interleavers 103-1 and 103-2. The encoding unit 101 generates a parity data sequence y1 using a convolutional code. On the other hand, the interleavers 103-1 and 103-2 respectively outputs data sequence u1 and u2 in the randomizing process. Then, the encoding unit 102 generates parity data sequence p1 from the data sequence u1 and generates parity data sequence p2 from the data sequence u2 using the convolutional code. The parity data sequence p1 and p2 are obtained by encoding the output of the interleavers 103-1 and 103-2, respectively.

The data sequence u1 and u2 are serially input to the encoding unit 102, and the encoding unit 102 sequentially encodes the data sequence. The serially output parity data sequences p1 and p2 correspond to the parity data sequence y2 shown in FIG. 10. A tail bit is added to the end of the parity data sequence.

The puncturing unit 107 selects a data element from a parity data sequence generated by the encoding unit 102 according to a predetermined selection pattern or an adaptively changed selection pattern, thereby generating a parity data sequence y3.

Described below is a puncturing operation. In this example, it is assumed that the parity data sequences p1 and p2 are serially output as shown in FIG. 18.

The selection pattern information is set for each of the parity data sequences p1 and p2. Here, "1" indicates that a corresponding data element is selected, and "0" indicates that a corresponding data element is not selected. A data element which has not been selected is finally discarded.

Figure 18:
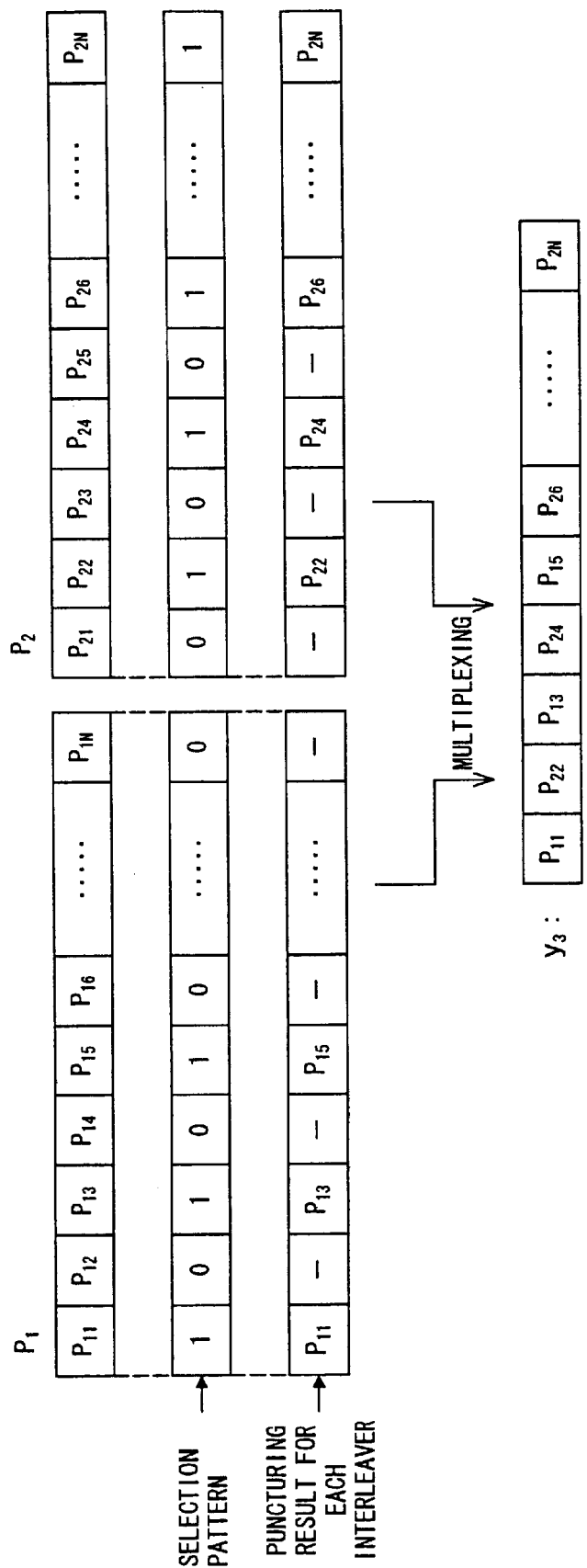
FIG. 18 and FIG. 19 show examples of generating parity data.

In FIG. 18, the selection pattern information in which only odd bits are set to "1" is provided for the parity data sequence p1, and the selection pattern information in which only even bits are set to "1" is provided for the parity data sequence p2. In this case, the first, third, fifth, . . . data elements are selected from the parity data sequence p1, and the second, fourth, sixth, . . . data elements are discarded. Similarly, the first, third, fifth, . . . data elements are discarded, and the second, fourth, sixth, . . . data elements are selected from the parity data sequence p2.

As a result, the output of the puncturing unit 107 (the parity data sequence y3 in FIG. 10) is a data sequence obtained by alternately selecting the data elements from the parity data sequences p1 and p2. Here, the parity data sequences p1 and p2 are obtained by encoding the output of the interleavers 103-1 and 103-2, respectively. Therefore, the output of the puncturing unit 107 reflects the effect of the randomizing process performed by both of the interleavers 103-1 and 103-2.

When the effect of the randomizing process by a plurality of interleavers is provided for the parity data sequence, the bit error rate characteristic is equivalent to the multi-dimensional turbo code described above by referring to FIGS. 2 and 3. That is, an error floor phenomenon is reduced, and the characteristic indicated by the line 2 shown in FIG. 2 can be obtained. This is confirmed by the simulation.

Figure 3:
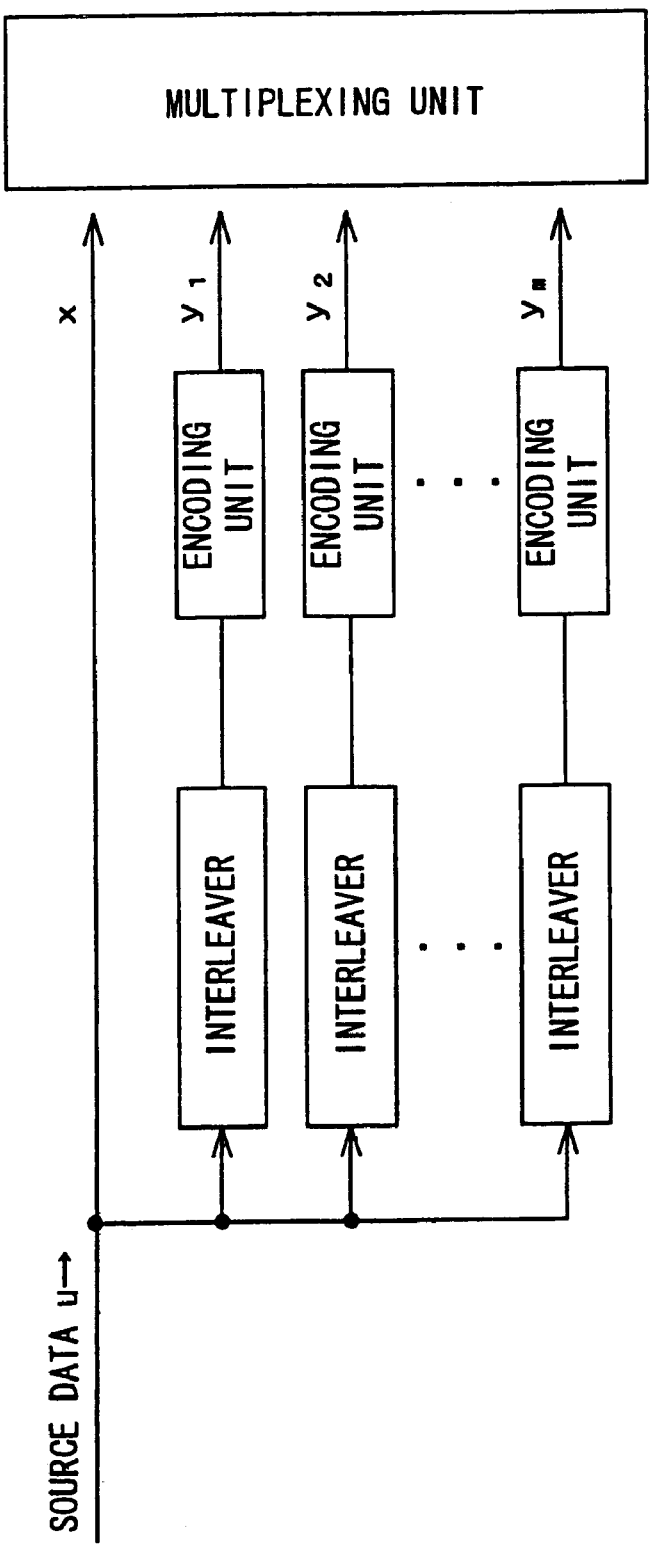
FIG. 3 shows the configuration of the encoding device for the multi-dimensional turbo code.

Thus, to suppress the error floor phenomenon, a plurality of interleaver, and a plurality of encoding units corresponding to the plurality of interleavers are provided in the conventional technology as shown in FIG. 3. However, according to the present embodiment, the combination of the above mentioned plurality of interleavers and the plurality of encoding units can be replaced with a plurality of interleavers and one encoding unit with an equivalent effect. That is, according to the present embodiment, the number of encoding units provided for the encoding device is two as shown in FIGS. 6, 9, 10, and 11.

On the other hand, in each decoding module forming part of the decoding device, decoding units equal in number to the encoding units in the encoding device are required as described above. That is, if two encoding units (encoding units 101 and 102) are provided in the encoding device 100, each of the decoding modules 210 is provided with two decoding units (decoding units 212 and 214) as shown in FIG. 14.

That is to say, with the conventional configuration, three or more encoding units are provided as shown in FIG. 3 to suppress the error floor phenomenon. Therefore, three or more decoding units are correspondingly required also in the decoding device. As a result, the configuration of the decoding device becomes complicated, thereby preventing the realization of a smaller, lighter, and cost-saving system. On the other hand, since the number of decoding units in the decoding device is smaller according to the present embodiment, the configuration of the decoding device is simple, and can be smaller, lighter, and cost-saving.

Figure 19:
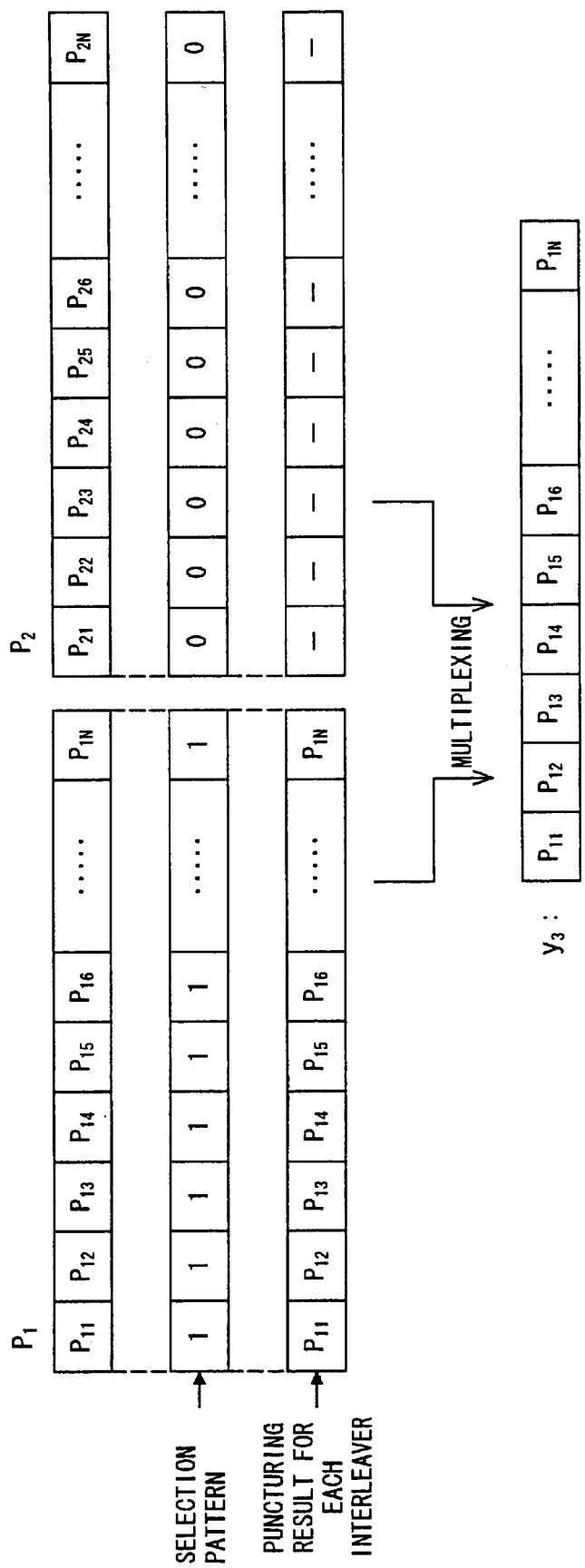

A selection pattern used when a parity data sequence is generated can be changed. For example, as shown in FIG. 19, if "all 1" is provided for the parity data sequence p1, and "all 0" is provided for the parity data sequence p2 as selection pattern information, then the data elements of the parity data sequence p1 are all selected while the data elements of the parity data sequence p2 are all discarded. In this case, the output of the puncturing unit 107 is the same data sequence as the parity data sequence p1. That is, the output of the puncturing unit 107 is not affected by the randomizing process performed by the interleaver 103-2, but is affected only by the randomizing process performed by the interleaver 103-1.

Figure 1:
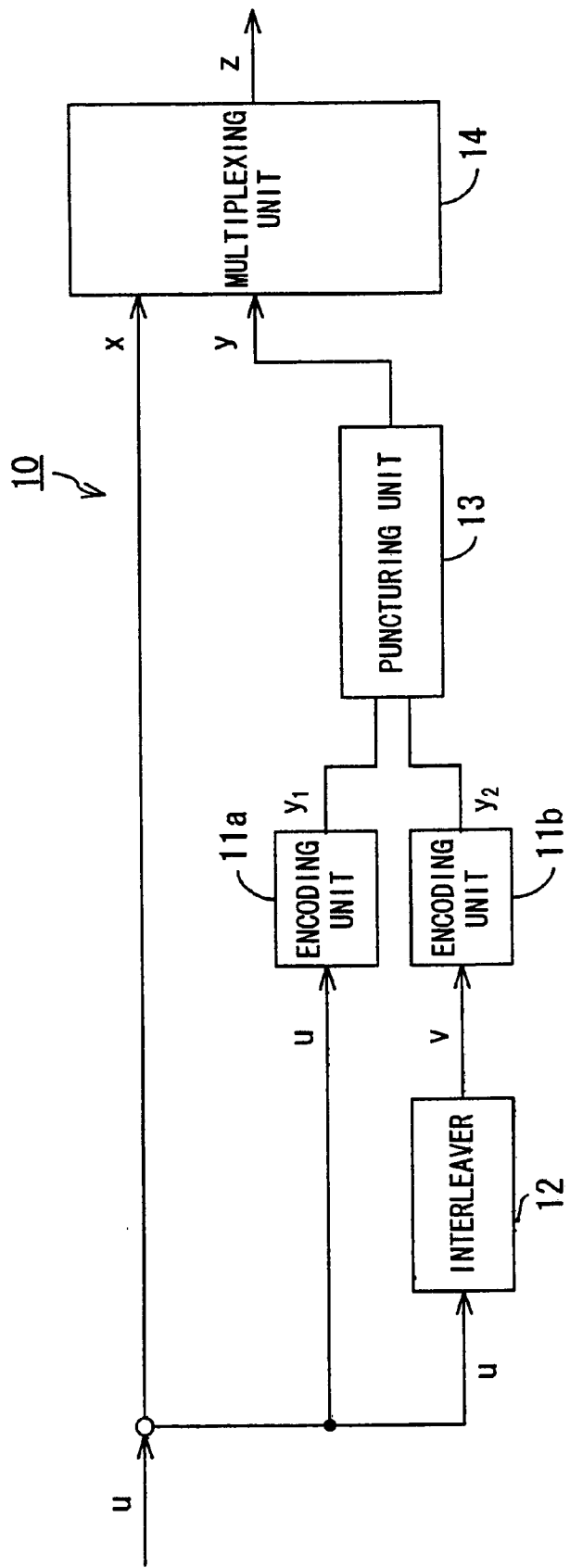
FIG. 1 shows the configuration of an existing encoding device using an error-correcting code.
Figure 2:
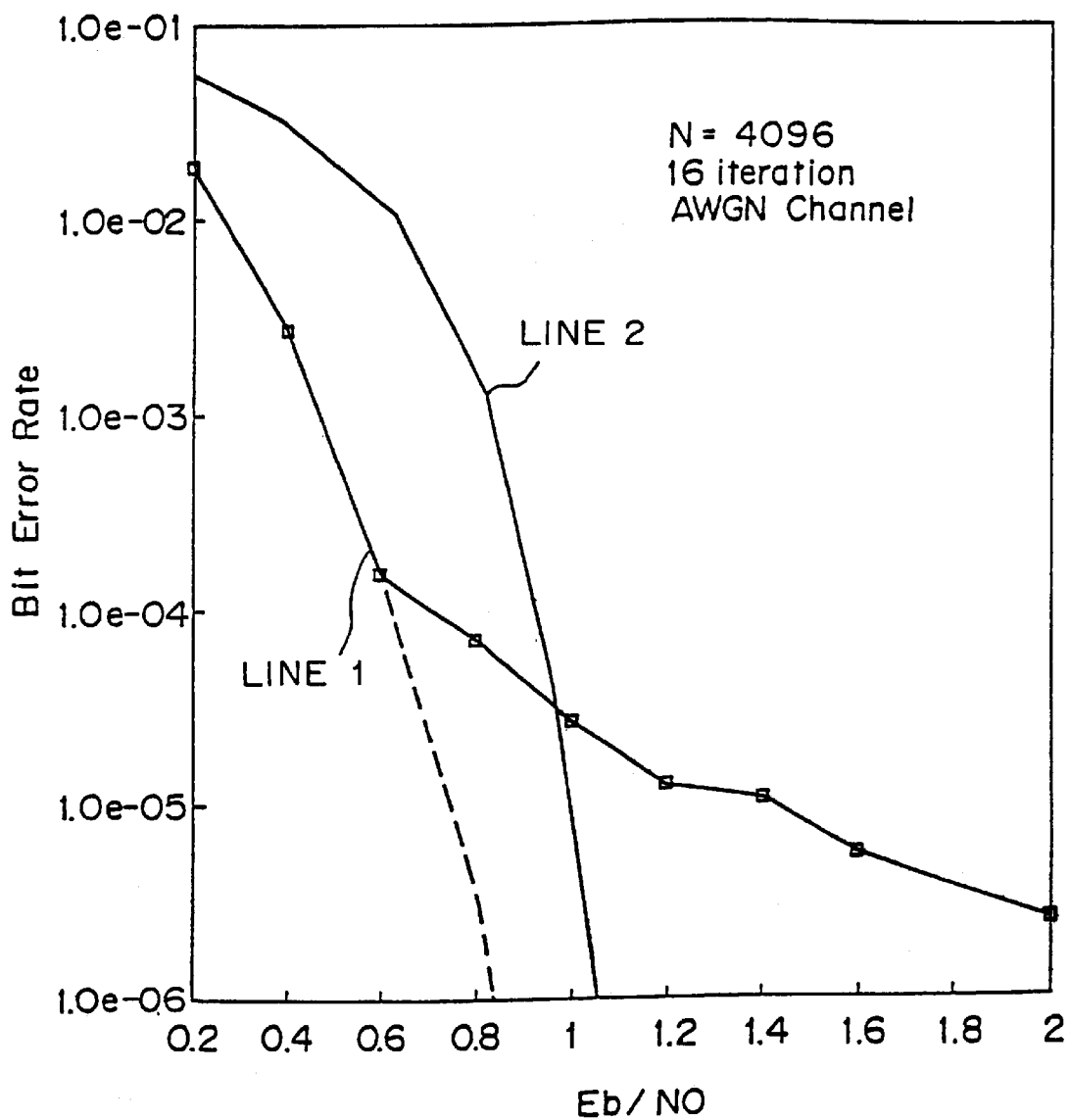
FIG. 2 shows the characteristics of codes.

When the effect of the randomizing process by one interleaver is reflected in a parity data sequence, the bit error rate characteristic is equivalent to an existing parallel concatenation code described above by referring to FIG. 1. That is, the characteristic indicated by the line 1 shown in FIG. 2 is obtained. This is confirmed by the simulation.

Thus, according to the present embodiment, both of the characteristics indicated by the lines 1 and 2 shown in FIG.

2 can be obtained by changing the selection patterns of the encoding device. In an area where the bit error rate is low ($10^{-5}$ or lower in FIG. 2), a code corresponding to the line 2 is more excellent. However, in an area where the bit error rate is not very low, a code corresponding the line 1 is more excellent. Therefore, if the communications condition (error rate and so on) is monitored, and the selection pattern is adaptively changed based on the monitor result, the communications can be performed constantly using the optimum code.

Figure 20:
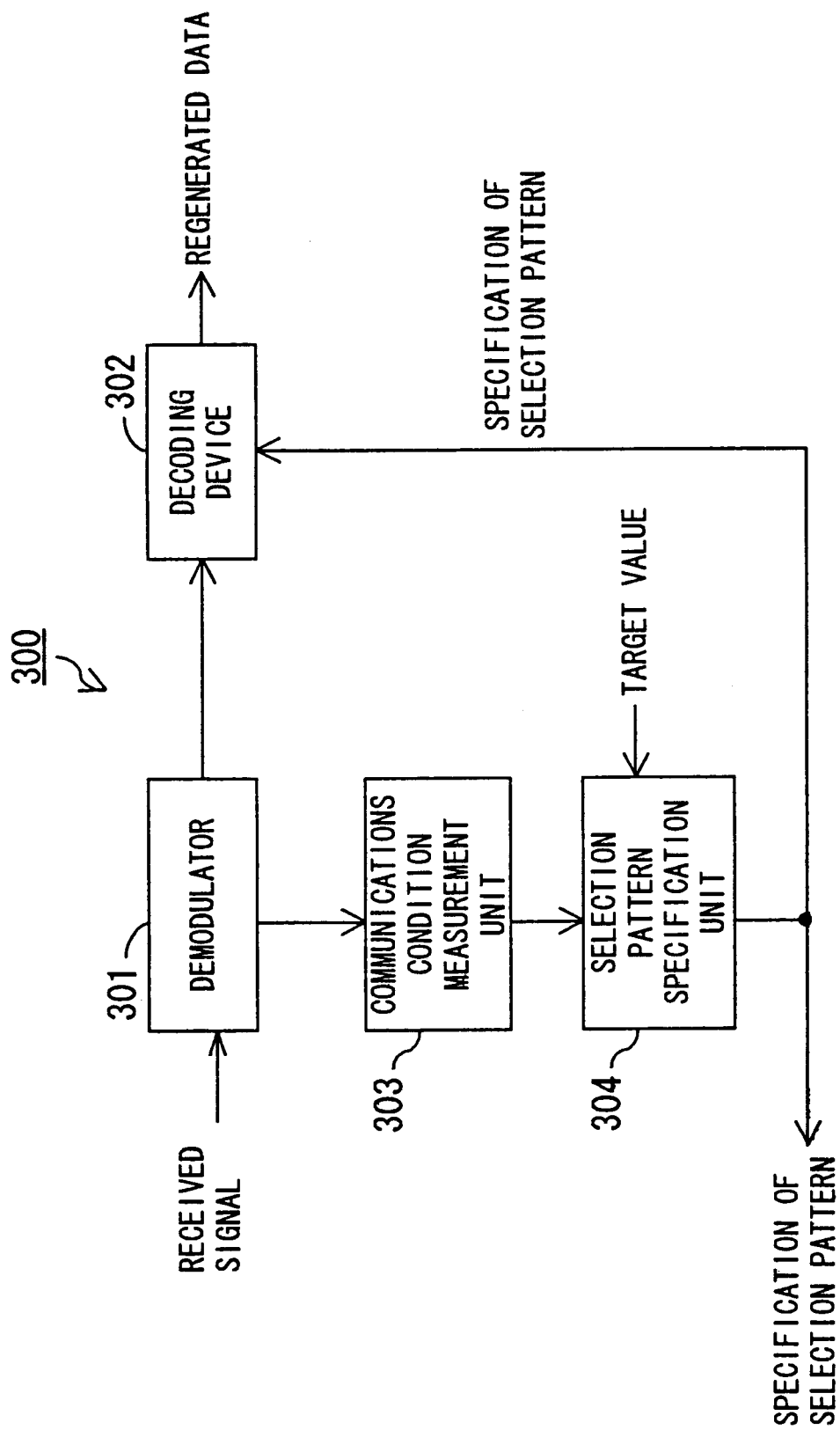
FIG. 20 is a block diagram of the receiving device in a system of adaptively changing a selection pattern.

FIG. 20 is a block diagram of the receiving device in the system in which a selection pattern is adaptively changed. A receiving device 300 corresponds to, for example, the mobile unit 30 shown in FIG. 4.

A demodulator 301 demodulates a received signal, and provides the result for a decoding device 302 and a communications condition measurement unit 303. The decoding device 302 regenerates source data from an encoded data sequence as described above by referring to FIGS. 13 through 16.

The communications condition measurement unit 303 measures various parameters relating to the communications condition according to a demodulated signal received from the demodulator 301. A measurement parameter can be, for example, an SNR (Signal-Noise-Ratio), an SIR (Signal-Interference-Ratio), a bit error rate, etc. A selection pattern specification unit 304 compares a parameter measured by the communications condition measurement unit 303 with a predetermined target value (threshold), and generates the specification of a selection pattern based on the comparison result. The specification of a selection pattern is provided for the decoding device 302 and transmitted to the transmission device. The transmission device is the base station 20 shown in FIG. 4.

The technology of detecting a parameter relating to the communications condition and feeding back the detected parameter from the receiving device to the transmission device are well known. For example, there is a system, to control the transmission power of a base station, using a mobile unit monitoring the parameter relating to the communications condition, and feeding back the monitor result from the mobile unit to the base station. The communications condition measurement unit 303 and the selection pattern specification unit 304 can be realized using the technology.

Figure 21:
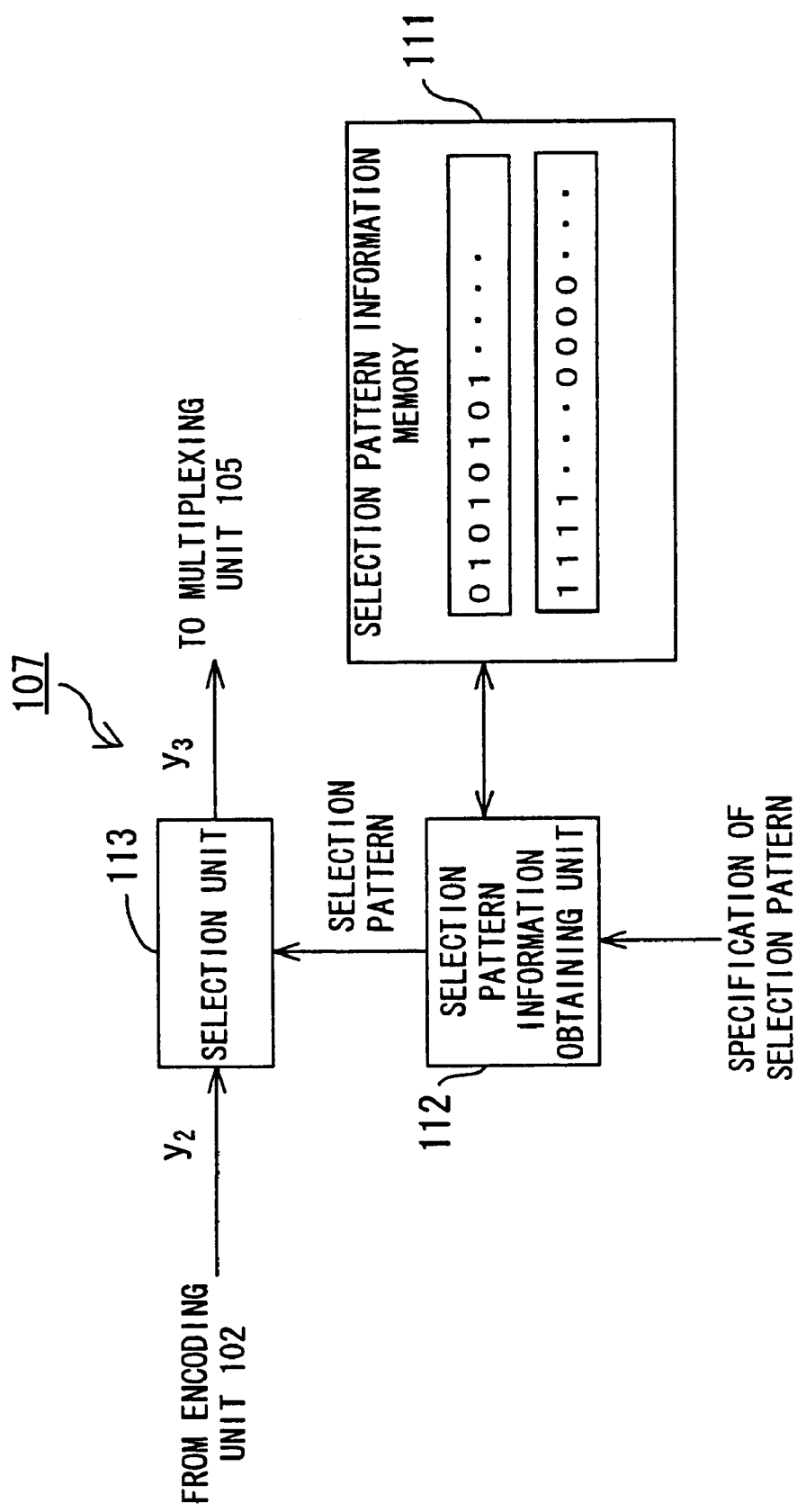
FIG. 21 is a block diagram of a puncturing unit of adaptively changing a selection pattern.

FIG. 21 is a block diagram of the puncturing unit for adaptively changing a selection pattern. The puncturing unit can be, for example, the puncturing unit 107 shown in FIG. 10.

A selection pattern information memory 111 is, for example, semiconductor memory, and stores plural sets of selection pattern information. The selection pattern information memory 111 stores at least the selection pattern information shown in FIGS. 18 and 19. A selection pattern information obtaining unit 112 obtains corresponding selection pattern information from the selection pattern information memory 111 according to the selection pattern specification transmitted from the receiving device. Then, a selection unit 113 selects one or more data elements from the data sequence generated by the encoding unit 102 according to the selection pattern information. The operation of the selection unit 113 has been described above by referring to FIG. 18 or 19. The selection pattern information obtaining unit 112 and the selection unit 113 can be realized by, for example, a program describing the above mentioned process procedure and the CPU for executing the program.

Furthermore, the selection pattern information memory 111, the selection pattern information obtaining unit 112, and the selection unit 113 can also be realized by hardware.

When a selection pattern is changed by a puncturing unit of the transmission device, the operation of the de-puncturing unit of the receiving device has also to be changed. Therefore, in FIG. 20, the specification of a selection pattern generated by the selection pattern specification unit 304 is also provided for the decoding device 302. Then, the de-puncturing unit (the de-puncturing unit 211 shown in FIG. 14) of the decoding device 302 is operated according to the specification.

With this configuration, since the selection pattern used in the puncturing process is adaptively changed based on the communications condition, communications can be established constantly using the optimum code. For example, assuming that selection pattern information for obtaining the characteristic indicated by the line 1 shown in FIG. 2 is used when "Eb/No" is small, and that selection pattern information for obtaining the characteristic indicated by the line 2 shown in FIG. 2 is used when "Eb/No" is large, the relationship between the bit error rate and the error floor phenomenon can be optimized. That is, the balance between the waterfall area (the area where an error rate considerably drops as the value of "Eb/No" becomes higher) and the floor area (the area where the error floor phenomenon occurs) can be improved.

In the above mentioned embodiment, two types of patterns are shown as selection pattern information in FIGS. 18 and 19. In the present embodiment, a desired selection pattern can be used. By changing a selection pattern, a desired bit error rate characteristic can be obtained.

Figure 22:
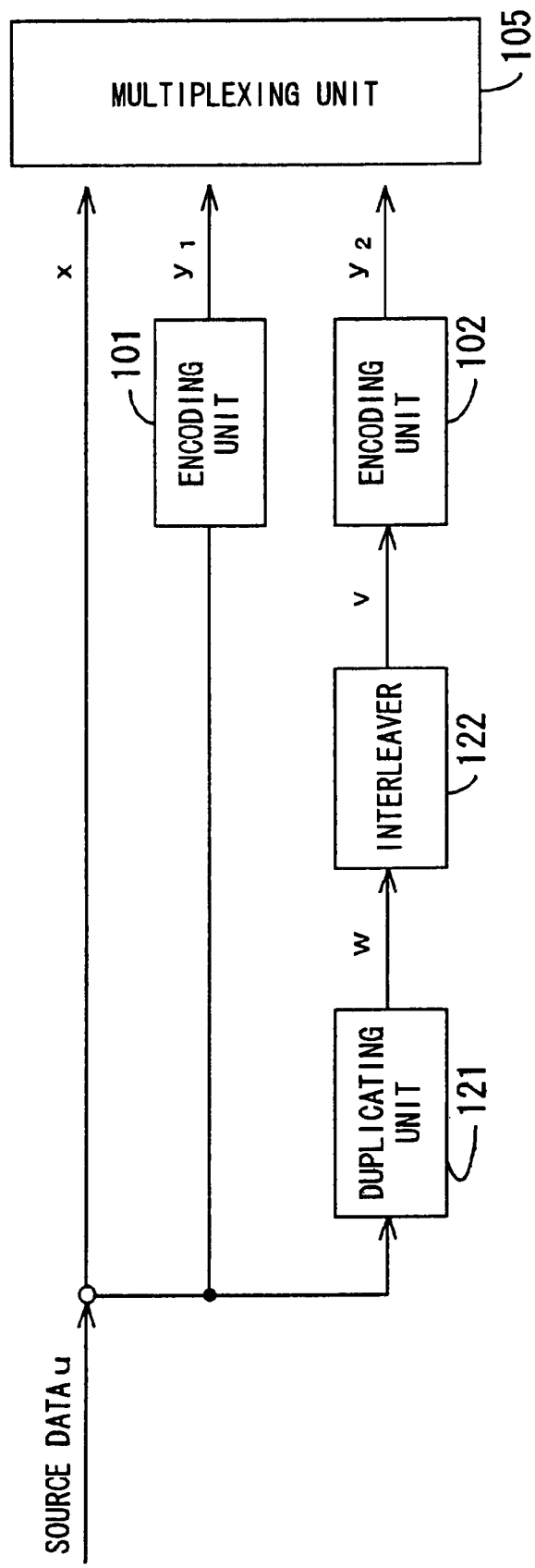
FIG. 22 is a block diagram of the encoding device of another embodiment of the present invention.

FIG. 22 is a block diagram of the encoding device according to another embodiment of the present invention. In FIG. 22, the encoding units 101 and 102, and the multiplexing unit 105 are the same as those shown in FIG. 6. That is, this encoding device can be realized by replacing the interleavers 103-1 through 103-m and the multiplexing unit 104 shown in FIG. 6 with a duplicating unit 121 and an interleaver 122.

Figure 23:
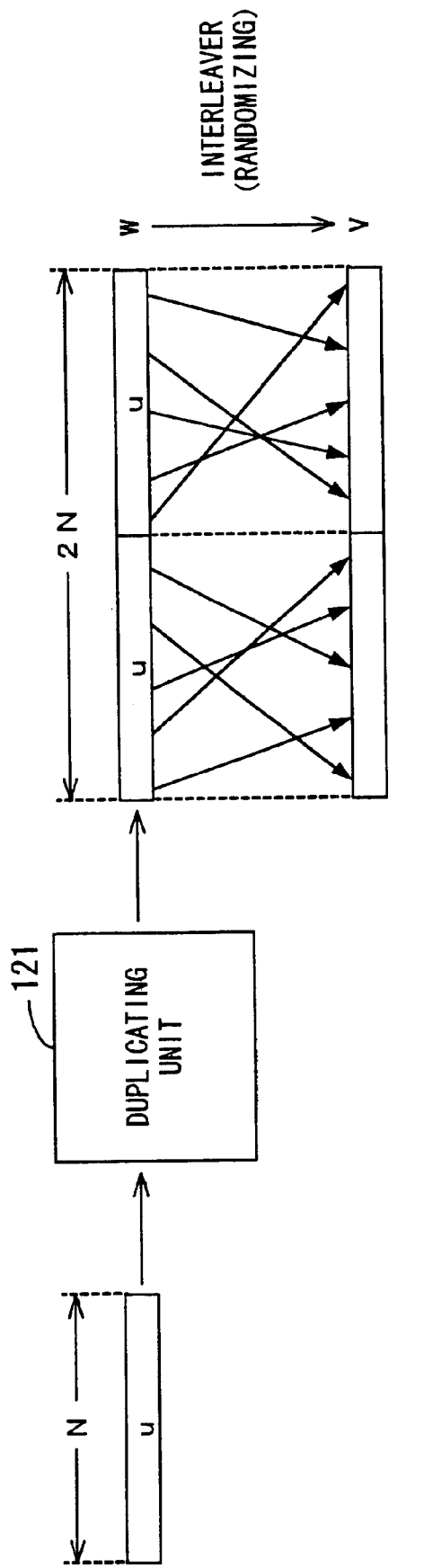
FIG. 23 shows an operation of a duplicating unit and an interleaver.

FIG. 23 shows the operations of the duplicating unit 121 and the interleaver 122. When the source data u is input, the duplicating unit 121 repeatedly outputs the source data u two times or more. That is, the duplicating unit 121 includes memory such as RAM, etc. and a device for controlling the memory, and temporarily stores the source data u when it is input. Then, it repeatedly reads and outputs predetermined times the source data u from the memory. Therefore, when the source data u is m times repeatedly read and output, the length of the data sequence w output from the duplicating unit 121 is "m×N" bits.

Unlike each of the interleavers 103-1 through 103-m shown in FIG. 6, the interleaver 122 performs a randomizing process on a data sequence whose data length is "m×N" bits. However, the randomizing process is performed by the interleaver 122 in units of the source data u, and the randomizing process on each set of source data u is different from each other. Therefore, as it is clear when FIG. 7 is compared with FIG. 23, the randomizing processes performed by the duplicating unit 121 and the interleaver 122 is the same as the randomizing process performed by the interleavers 103-1 through 103-m connected in parallel.

Therefore, the parity data sequence generated by the encoding device shown in FIG. 22 is affected by a plurality of different randomizing processes, and the bit error rate characteristic equivalent to the multi-dimensional turbo code can be obtained.

The decoding device for decoding the encoded data generated by this encoding device can be realized by the decoding module shown in FIG. 14. However, the interleaver and the de-interleaver provided in that decoding module are designed corresponding to the interleaver 122.

The encoding device according to the above mentioned embodiment adopts a systematic code, and performs a convolutional process. However, the present invention is not limited to this configuration. That is to say, the encoding device according to the present invention is not limited to a systematic code or a convolutional code. For example, in FIG. 6, a block code (for example, a hamming code, a BCH code, etc.) can be used.

Furthermore, the above mentioned embodiment is based on the parallel concatenation code, but the present invention is not limited to this code. For example, the present invention can also be applied to a serial concatenation code, and a combined code of a parallel concatenation code and a serial concatenation code.

Figure 24:
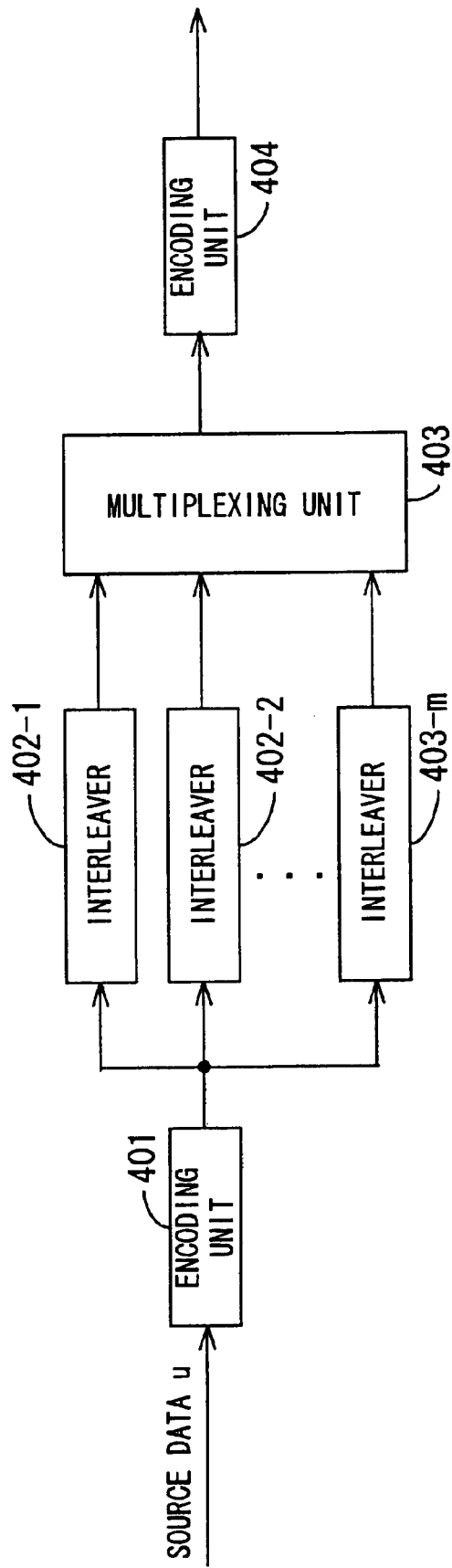
FIG. 24 is a block diagram of the encoding device in which the present invention is applied to a serial concatenation code.

FIG. 24 is a block diagram of the encoding device to which the present invention is applied to a serial concatenation code. In this case, the source data u is encoded by an encoding unit 401, and is then provided for interleavers 402-1 through 402-m connected in parallel. The interleavers 402-1 through 402-m randomize the source data u. The outputs from the interleavers 402-1 through 402-m are multiplexed by a multiplexing unit 403, provided for an encoding unit 404 for further encoding. With the configuration, the characteristic of a code can be improved by the interleavers 402-1 through 402-m performing different randomizing processes.

As described above, according to the present invention, the error floor phenomenon can be suppressed without complicating the configuration of the decoding device. Furthermore, if a selection pattern is adaptively changed depending on the communications condition, the communications can be established constantly using the optimum code.

Industrial Applicability

The present invention can be widely applied in coding and decoding data. The field of application relates to communications systems. Especially, the present invention is effective in a mobile communications system in which transmission errors frequently occur. Furthermore, the present invention can also be effectively applied to a device for storing data.

What is claimed is:

1. An encoding device which encodes source data, comprising:
    a first encoding unit encoding source data or a data sequence obtained by randomizing the source data;
    a plurality of randomizing units generating different data sequences by respectively randomizing the source data;
    a second encoding unit encoding output of said plurality of randomizing units;
    a selection unit selecting a data element from an encoded data sequence encoded by said second encoding unit according to a transmission condition on a transmission path or channel between said encoding device and a corresponding decoding device; and
    an output unit outputting the source data and parity data obtained based on outputs of said first encoding unit and said selection unit.

2. The device according to claim 1, wherein
    said first and second encoding units performs convolutional encoding, respectively.

3. The device according to claim 1, wherein
    said plurality of randomizing units are interleavers.

4. The device according to claim 1, wherein:
    when a data length of the source data is N bits, and there are m randomizing units, said second encoding unit encodes a data sequence whose data length is "m×N" bits.

5. The device according to claim 1, wherein
    said output unit comprises:
    a selection unit selecting one or more data element from the output of said second encoding unit; and
    a parity data generation unit generating the parity data based on output of said first encoding unit and output of said selection unit.

6. The device according to claim 1, wherein
    said output unit comprises:
    a division unit dividing a data sequence output by said second encoding unit into a plurality of data sequence;
    an assignment unit assigning a selection pattern for specifying a data element to be selected for the plurality of data sequence obtained by said division unit;
    a selection unit selecting a data element from the plurality of data sequence according to the selection pattern assigned by said assignment unit; and
    a parity data generation unit generating the parity data based on output of said first encoding unit and output of said selection unit.

7. The device according to claim 6, wherein
    said selection unit selects a data element based on a data transmission condition to a decoding device.

8. The device according to claim 6, wherein
    said selection unit changes a pattern for selecting a data element based on an SN ratio of a received signal detected by a decoding device.

9. An encoding device which encodes source data, comprising:
    a first encoding unit encoding source data or a data sequence obtained by randomizing the source data;
    a plurality of randomizing units generating different data sequences by respectively randomizing the source data;
    a multiplexing unit multiplexing the outputs of said plurality of randomizing units;
    a second encoding unit encoding the output of said multiplexing unit; and
    an output unit outputting the source data and parity data obtained based on outputs of said first and second encoding units.

10. An encoding device which encodes source data, comprising:
    a first encoding unit encoding source data or a data sequence obtained by randomizing the source data;
    a duplicating unit duplicating at least a part of the source data to obtain a plurality of identical data sequences;
    a randomizing unit sequentially randomizing the plurality of identical data sequences with different randomizing patterns;
    a second encoding unit encoding output of said randomizing unit; and
    an output unit outputting the source data and parity data obtained based on output of said first and second encoding units.

11. The device according to claim 10, wherein
when a data length of the source data is N, and said duplicating unit outputs the source data m times repeatedly, an interleaver having a length of "m×N" is used as said randomizing unit.

12. An encoding device, comprising:
a parallel concatenation encoder comprising a first encoder and a second encoder connected in parallel;
a plurality of randomizing units, provided at a stage before said second encoder, generating different data sequence by randomizing input data sequence, respectively; and
a selection unit selecting a data element from an encoded data sequence encoded by said second encoding unit according to a transmission condition on a transmission path or channel between said encoding device and a corresponding decoding device.

13. An encoding device, comprising:
a serial concatenation encoder comprising a first encoder and a second encoder serially connected at a stage after said first encoder;
a plurality of randomizing units, provided between said first encoder and said second encoder, generating different data sequence by randomizing a data sequence generated by said first encoder, and providing a generated data sequence for said second encoder; and
a selection unit selecting a data element from an encoded data sequence encoded by said second encoding unit according to a transmission condition on a transmission path or channel between said encoding device and a corresponding decoding device.

14. A base station transmitting and receiving a radio signal containing encoded data to and from a mobile unit in a radio communications system, having an encoding device, said encoding device comprising:
a first encoding unit encoding source data to be transmitted to the mobile unit or a data sequence obtained by randomizing the source data;
a plurality of randomizing units generating different data sequence by respectively randomizing the source data;
a second encoding unit encoding output of said plurality of randomizing units;
a selection unit selecting a data element from an encoded data sequence encoded by said second encoding unit according to a transmission condition on a transmission path or channel between said encoding device and a corresponding decoding device
an output unit outputting the source data and parity data obtained based on output of said first encoding unit and said selection unit.

15. A communications system, which transmits a signal containing encoded data, including an encoding device to encode data to be transmitted and a decoding device to decode the encoded data,
said encoding device comprising:
a first encoder encoding source data or a data sequence obtained by randomizing the source data;
a plurality of first interleavers generating different data sequence by respectively randomizing the source data;
a second encoder encoding output of said plurality of first interleavers;
a selection unit selecting a data element from an encoded data sequence encoded by said second encoding unit according to a transmission condition on a transmission path or channel between said encoding device and a corresponding decoding device; and
a multiplexer multiplexing the source data and parity data obtained based on output of said first encoder and the selection unit, and outputting the multiplexed data as encoded data;
said decoding device comprising:
a first decoder, provided corresponding to said first encoder, decoding a received signal according to the transmission condition on the transmission path or channel between said decoding device and said encoding device;
a plurality of second interleavers performing a same randomizing process as a plurality of first interleavers provided in said encoding device for output of said first decoder;
a second decoder, provided corresponding to said second encoder, decoding output of said plurality of second interleavers;
a division unit dividing output of said second decoder into a plurality of data sequences;
a plurality of de-interleavers, provided corresponding to said plurality of second interleaver, performing an inverse randomizing process for a data sequence divided by said division unit;
a combination unit combining outputs of said plurality of de-interleavers; and
a regeneration unit regenerating the source data using output of said combination unit.

16. The system according to claim 15, wherein
said combination unit adds up outputs of said plurality of de-interleavers for each symbol.

17. A method for encoding source data, comprising:
generating first data sequence by encoding source data or a data sequence obtained by randomizing the source data;
randomizing the source data with different randomizing processes;
generating a second data sequence by encoding a result of the randomizing processes;
selecting a data element from the second data sequence according to a transmission condition on a transmission path or channel between said encoding device and a corresponding decoding device; and
outputting the source data and parity data obtained based on the first data sequence and the selected data element.

18. A decoding device which decodes encoded data encoded by an encoding device, said encoding device comprising a first encoder encoding source data or a data sequence obtained by randomizing the source data; a plurality of first interleavers generating different data sequence by respectively randomizing the source data; a second encoder encoding output of said plurality of first interleavers; a selector selecting a data element from the encoded output encoded by said second encoder according to a transmission condition on a transmission path or channel between said encoding device and said decoding device, and a multiplexer multiplexing the source data and parity data obtained based on output of said first encoder and said selector, and outputting the multiplexed data as encoded data, wherein said decoding device comprises:
a first decoder, provided corresponding to said first encoder, decoding a received signal according to the transmission condition on the transmission path or channel between said decoding device and a corresponding encoding device;

a second interleaver performing a same randomizing process as a plurality of first interleavers for output of said first decoder;

a second decoder, provided corresponding to said second encoder, decoding output of said second interleaver; and a de-interleaver, provided corresponding to said second interleaver, performing an inverse randomizing process for a data sequence from said second decoder to regenerate the source data.

* * * * *